(12) United States Patent
Rawat et al.

(10) Patent No.: US 12,406,705 B2
(45) Date of Patent: *Sep. 2, 2025

(54) IN-MEMORY COMPUTATION CIRCUIT USING STATIC RANDOM ACCESS MEMORY (SRAM) ARRAY SEGMENTATION

(71) Applicant: STMicroelectronics International N.V., Geneva (CH)

(72) Inventors: Harsh Rawat, Faridabad (IN); Kedar Janardan Dhori, Ghaziabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 205 days.

This patent is subject to a terminal disclaimer.

(21) Appl. No.: 18/136,491

(22) Filed: Apr. 19, 2023

(65) Prior Publication Data

US 2023/0410862 A1 Dec. 21, 2023

Related U.S. Application Data

(60) Provisional application No. 63/345,483, filed on May 25, 2022.

(51) Int. Cl.
*G11C 7/16* (2006.01)
*G11C 7/12* (2006.01)
*G11C 8/08* (2006.01)

(52) U.S. Cl.
CPC ............... *G11C 7/16* (2013.01); *G11C 7/12* (2013.01); *G11C 8/08* (2013.01)

(58) Field of Classification Search
CPC .... G11C 7/16; G11C 7/12; G11C 8/08; G11C 7/1006; G06N 3/065
(Continued)

(56) References Cited

U.S. PATENT DOCUMENTS 8,331,162 B2 12/2012 Kim et al.
8,593,860 B2 11/2013 Shu et al.
(Continued)

FOREIGN PATENT DOCUMENTS

CN 113255904 A 8/2021
JP 2015225686 A 12/2015

OTHER PUBLICATIONS

X. Si , "24.5 A Twin-8T SRAM Computation-In-Memory Macro for Multiple-Bit CNN-Based Machine Learning," IEEE International Solid-State Circuits Conference (ISSCC), 2019.
(Continued)

*Primary Examiner* — Huan Hoang
(74) *Attorney, Agent, or Firm* — Crowe & Dunlevy LLC

(57) ABSTRACT

An in-memory computation circuit includes a memory array including sub-arrays of with SRAM cells connected in rows by word lines and in columns by local bit lines. A row controller circuit selectively actuates one word line per sub-array for an in-memory compute operation. A global bit line is capacitively coupled to many local bit lines in either a column direction or row direction. An analog global output voltage on each global bit line is an average of local bit line voltages on the capacitively coupled local bit lines. The analog global output voltage is sampled and converted by an analog-to-digital converter (ADC) circuit to generate a digital decision signal output for the in-memory compute operation.

24 Claims, 14 Drawing Sheets

(58) Field of Classification Search
USPC .................................................. 365/185.03
See application file for complete search history.

(56) References Cited

U.S. PATENT DOCUMENTS

| | | | |
|---|---|---|---|
| 8,693,236 | B2 | 4/2014 | Shu et al. |
| 9,406,351 | B2 | 8/2016 | Stansfield |
| 2014/0269091 | A1 | 9/2014 | Zheng et al. |
| 2015/0138876 | A1 | 5/2015 | Roy et al. |
| 2019/0043560 | A1 | 2/2019 | Sumbul et al. |
| 2020/0058351 | A1 | 2/2020 | Shin |
| 2021/0391003 | A1 | 12/2021 | Chiang et al. |
| 2022/0067501 | A1 | 3/2022 | Horng et al. |
| 2022/0398438 | A1* | 12/2022 | Zhang ............... G11C 11/5642 |
| 2023/0252248 | A1 | 8/2023 | Lee et al. |

OTHER PUBLICATIONS

Area-Efficient and Variation-Tolerant In-Memory BNN Computing using 6T Sram Array, Symposium on Circuits VLSI 2019.

X-SRAM: Enabling In-Memory Boolean Computations in CMOS Static Random Access Memories, IEEE Transactions on Circuits and Systems—I: Regular Papers, vol. 65, No. 12, Dec. 2018.

M. Kang et al., "A Multi-Functional In-Memory Inference Processor Using a Standard 6T SRAM Array," IEEE Journal of Solid-State Circuits, vol. 53, No. 2, 2018.

J. Zhang et al., "In-memory computation of a machine-learning classifier in a standard 6T SRAM array," IEEE Journal of Solid-State Circuits, vol. 52, No. 4, 2017.

A. Biswas and A. P. Chandrakasan, "CONV-SRAM: An Energy-Efficient SRAM with In-Memory Dot-Product Computation for Low-Power Convolutional Neural Networks," IEEE Journal of Solid-State Circuits (JSSC), vol. 54, No. 1, 2019.

X. Si et al., "A 28nm 64Kb 6T SRAM Computing-in-Memory Macro with 8b MAC Operation for AI Edge Chips," IEEE International Solid-State Circuits Conference (ISSCC), 2020.

J.-W. Su et al., "A 28nm 64Kb Inference-Training Two-Way Transpose Multibit 6T Sram Compute-in-Memory Macro for AI Edge Chips," IEEE International Solid-State Circuits Conference (ISSCC), 2020.

S. Yin et al., "XNOR-SRAM: In-Memory Computing SRAM Macro for Binary/Ternary Deep Neural Networks," IEEE Journal of Solid-State Circuits (JSSC), vol. 55, No. 6, 2020.

H. Jia et al., "A Programmable Heterogeneous Microprocessor Based on Bit-Scalable In-Memory Computing," in IEEE Journal of Solid-State Circuits, vol. 55, No. 9, 2020.

Z. Jiang et al., "C3SRAM: An In-Memory-Computing SRAM Macro Based on Robust Capacitive Coupling Computing Mechanism," IEEE Journal of Solid-State Circuits (JSSC), vol. 55, No. 7, 2020.

H. Valavi et al., "A 64-Tile 2.4-Mb In-Memory-Computing CNN Accelerator Employing Charge-Domain Compute," IEEE Journal of Solid-State Circuits, vol. 54, No. 6, 2019.

Q. Dong, "A 351TOPS/W and 372.4GOPS Compute-in-Memory SRAM Macro in 7nm FinFET CMOS for Machine-Learning Applications," IEEE International Solid-State Circuits Conference (ISSCC), 2020.

EPO Search Report and Written Opinion for counterpart EP Appl. No. 23174857.5, report dated Nov. 17, 2023, 9 pgs.

Lee Eunyoung et al: "A Charge Domain Scalable Weight in Memory Computing Macro With Dual SRAM Architecture for Precisiion Scalable DNN Accelerators," IEEE Transactions on Circuits and Systems I: Regular Papers, vol. 68 No. 8, May 21, 2021 pp. 3305-3316, XP011865738.

Xiao Kanglin et al: "A Computing in Memory SRAM Macro Based on Fully Capacitive Coupling With Hierarchical Capacity Attenuator For A-b MAC Operation," 2022 IEEE International Symposium on Circuits and Systems (ISCAS), May 27, 2022 pp. 2551-2555, XP034224718.

Yu, Chengshuo, et al: "A Zero-Skipping Reconfigurable SRAM In-Memory Computing Macro with Binary-Searching ADC," ESSCIRC, 2021, 4 pgs.

Jiang, Zhewei, et al: "C3SRAM: An In-Memory-Computing SRAM Macro Based on Robust Capacitive Coupling Computing Mechanism," IEEE Journal of Solid-State Circuits, vol. 55, No. 7, Jul. 2020, pp. 1888-1897.

H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.

H. Jia et al., 15.1 A Programmable Neural-Network Inference Accelerator Based on Scalable In-Memory Computing, 2021 IEEE International Solid-State Circuits Conference (ISSCC), 2021, pp. 236-238, doi: 10.1109/ISSCC42613.2021.9365788.

Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.

Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.

V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.

J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.

J. Lee, H. Valavi, Y. Tang and N. Verma, Fully Row/Column-Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.

\* cited by examiner

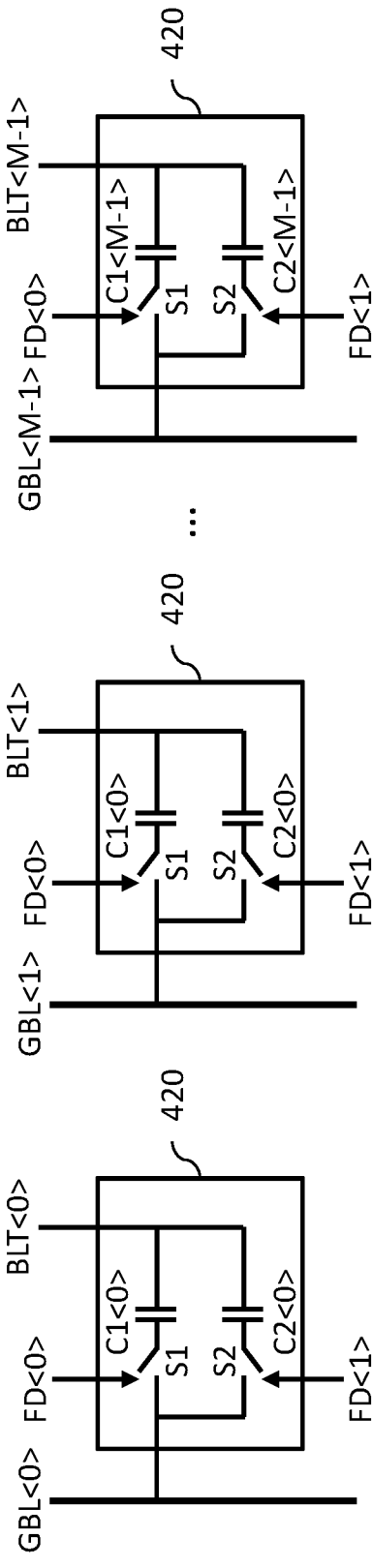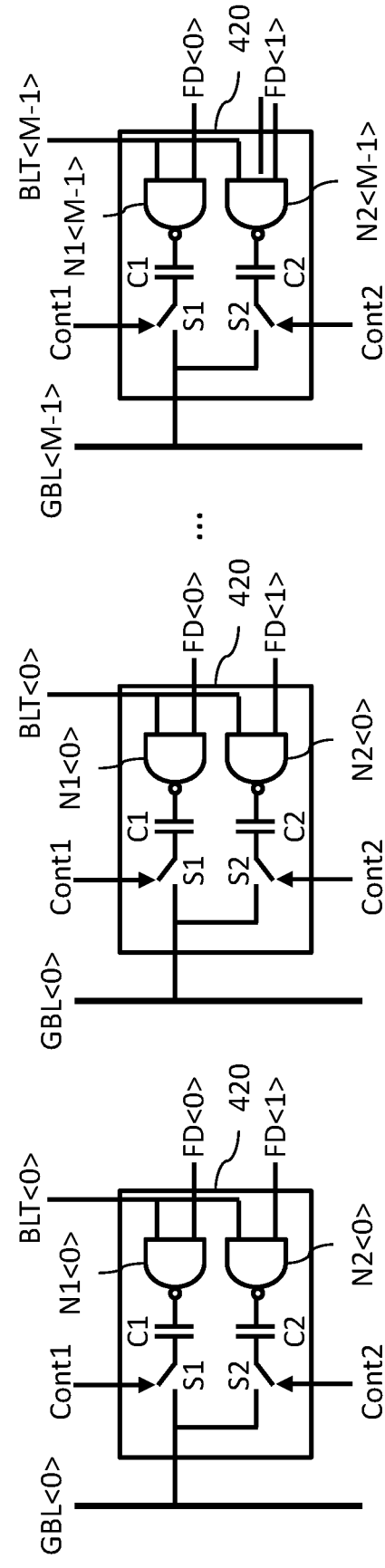
FIG. 11A
FIG. 11B

IN-MEMORY COMPUTATION CIRCUIT USING STATIC RANDOM ACCESS MEMORY (SRAM) ARRAY SEGMENTATION

CROSS REFERENCE TO RELATED APPLICATIONS

This application claims priority from United States Provisional Application for Patent No. 63/345,483, filed May 25, 2022, the disclosure of which is incorporated herein by reference.

TECHNICAL FIELD

Embodiments relate to an in-memory computation circuit utilizing a static random access memory (SRAM) array and, in particular, to a segmented architecture of the array.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line BLR in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog current signals on the pairs of complementary bit lines BLT and BLC (and/or on the read bit line BLR) for the M columns and generates a decision output for the in-memory compute operation from those analog current signals. The column processing circuit 20 can be implemented to support processing where the analog current signals on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read bit line BLR and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 receives the feature data for the in-memory compute operation and in response thereto performs the function of selecting which ones of the word lines WL<0> to WL<N–1> are to be simultaneously accessed (or actuated) in parallel during an in-memory compute operation, and further functions to control application of pulsed signals to the word lines in accordance with that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation dependent on the received feature data. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

FIG. 3 is a timing diagram showing simultaneous application of the example pulse width modulated word line signals to plural rows of memory cells 14 in the SRAM array 12 for a given in-memory compute operation, and the development over time of voltages Va,T and Va,C on one corresponding pair of complementary bit lines BLT and BLC, respectively, in response to sinking of cell read current due to the pulse width(s) of those word line signals and the logic state of the bits of the computational weight stored in the memory cells 14. The representation of the voltage Va levels as shown is just an example. After completion of the computation cycle of the in-memory compute operation, the voltage Va levels return to the bit line precharge Vdd level. It will be noted that a risk exists that the voltage on at least one of the bit lines BLT and BLC may fall from the Vdd voltage to a level below the write margin where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

SUMMARY

In an embodiment, an in-memory computation circuit comprises: a memory array including a plurality of sub-arrays, wherein each sub-array includes static random access memory (SRAM) cells arranged in a matrix with plural rows and plural columns, each row including a word line connected to the SRAM cells of the row, and each column including a local bit line connected to the SRAM cells of the column, said SRAM cells storing bits of weight data for an in-memory compute operation; a word line driver circuit for each row having an output connected to drive the word line of the row; a row controller circuit configured to simultaneously actuate only one word line per sub-array for the in-memory compute operation by applying pulses through the word line driver circuits to the word lines; and a plurality of global bit lines, where each global bit line is capacitively coupled to a plurality of local bits lines.

Each global bit line may extend parallel to corresponding columns of memory cells in the plurality of sub-arrays, and the capacitive coupling is formed between each global bit line and the local bit lines of the corresponding columns of memory cells in the plurality of sub-arrays.

Each global bit line may alternatively extend parallel to rows of memory cells in a corresponding sub-array of the plurality of sub-arrays, and the capacitive coupling is formed between each global bit line and the local bit lines for columns of memory cells in the corresponding sub-array of the plurality of sub-arrays.

In an embodiment, a computation circuit coupled to each global bit line includes an analog-to-digital converter (ADC) circuit that is configured to sample and convert an analog global output voltage from the global bit line to generate a digital decision output for the in-memory compute operation.

In an embodiment, a switching circuit is configured to selectively connect at least two global bit lines of the plurality of global bit lines for charge sharing to generate the analog global output voltage which is converted by an analog-to-digital converter (ADC) circuit of a computation circuit to generate a digital decision output for the in-memory compute operation.

BRIEF DESCRIPTION OF THE DRAWINGS

For a better understanding of the embodiments, reference will now be made by way of example only to the accompanying figures in which:

FIGS. 11A and 11B are circuit diagrams for embodiments of a coupling circuit used in the circuit of FIG. 10A.

DETAILED DESCRIPTION OF THE DRAWINGS

Figure 4A:
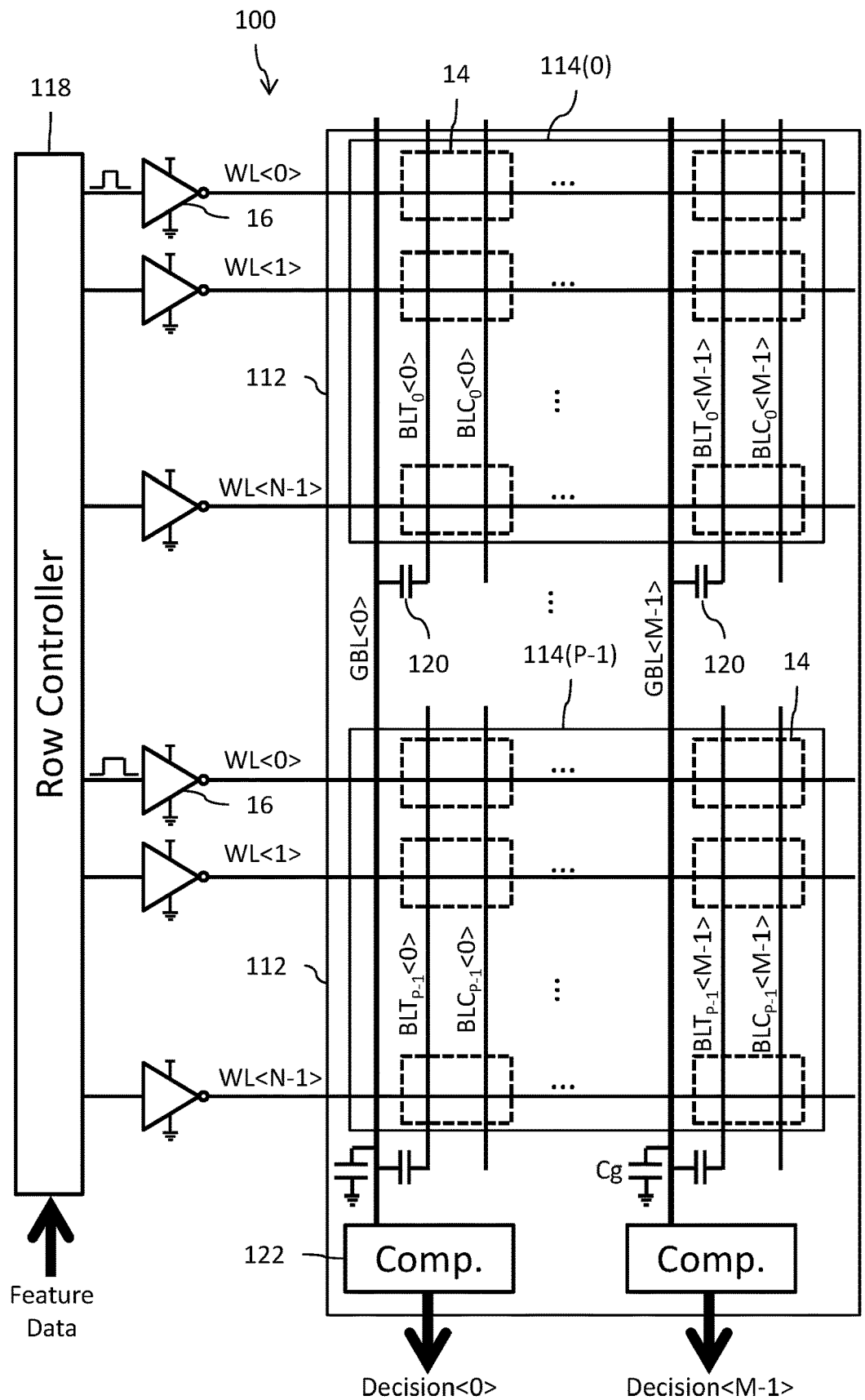
FIGS. 4A to 4C are schematic diagrams of embodiments for an in-memory computation circuit.

Reference is now made to FIG. 4A which shows a schematic diagram of an in-memory computation circuit 100. The circuit 100 utilizes a static random access memory (SRAM) array 112 that is segmented (i.e., partitioned) into a plurality of sub-arrays 114. In this example, there are P sub-arrays 114(0) to 114(P−1) within the array 112. Each sub-array 114(i), where i is the sub-array index from 0 to P−1, includes standard 6T SRAM memory cells 14 (see, FIG. 2) arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line BLR. The cells 14 in a common row of each sub-array 114 are connected to each other through a common word line WL (and through the common read word line RWL in the 8T-type implementation). The cells 14 in a common column of each sub-array 114 are connected to each other through a common pair of complementary bit lines BLT and BLC (and through the common read bit line BLR in the 8T-type implementation). In the illustrated example, for a given sub-array 114($i$) there is a true bit line BLT$_i$<j>, where j is a column index from 0 to M−1, coupled to the j-th column of memory cells 14, and there is a complement bit line BLC$_i$<j> coupled to that same j-th column of memory cells 14. Each word line WL, RWL is driven by a word line driver circuit 16 which may be implemented as a CMOS driver circuit (for example, a series connected p-channel and n-channel MOSFET transistor pair forming a logic inverter circuit). In the illustrated example, for a given sub-array 114($i$), there is a word line WL<k>, where k is a row index from 0 to N−1, coupled to the k-th row of memory cells 14.

The word line signals applied to the word lines, and driven by the word line driver circuits 16, are generated from feature data input to the in-memory computation circuit 100 and controlled by a row controller circuit 118. In response to the feature data, the row controller circuit 118 selects the word line WL for one row at a time in each sub-array 114 in connection with the execution of a given in-memory compute operation and applies a pulsed word line signal to that selected word line. The pulsed word line signals on the asserted individual word lines in the different sub-arrays 114 thus carry the feature data. In a preferred embodiment, the width of the word line signal pulse is selected so that a full swing on the bit line BL is achieved when reading the bit of the weight data from the memory cell 14 (i.e., one of the complementary bit lines BLT or BLC will be fully discharge). Thus, in response to the assertion of the word line signal, and as a function of the logic state of the weight bit stored in the accessed memory cell 14, local bit line voltages $V_L$ develop on the complementary bit lines BLT and BLC.

In an alternative embodiment, a pulse width modulation (PWM) dependent on the received feature data may be applied by the row controller 118 to the word line signals for the in-memory compute operation. Alternatively, a period pulse modulation (PTM) dependent on the received feature data may be applied by the row controller 118 to the word line signals for the in-memory compute operation. Still further, the pulsed word line signal format can instead be an encoded pulse train dependent on the received feature data for the in-memory compute operation. No matter what the nature of the word line signal pulse, the local bit line voltage $V_L$ that develops is dependent on the combination of the feature data and the weight data.

FIG. 4A specifically illustrates an example where the first word lines WL<0> in each of the plurality of sub-arrays 114 are being simultaneously driven by PWM word line signals through the word line driver circuits 16 in response to the feature data for the in-memory compute operation. In an embodiment, the row controller circuit 118 may sequentially select each of the word lines WL<0> through WL<N−1> in connection with executing the in-memory compute operation. In any case, it is preferable that only one word line (not necessarily the same word line) at a time per sub-array 114 be asserted in order to minimize the risk of inadvertent bit flip within each sub-array 114 during the in-memory compute operation.

The array 112 further includes a plurality of global bit lines GBL<0> to GBL<M−1> that are coupled through coupling circuits 120 to corresponding (local) bit lines (shown here, by example only, as the true bit lines BLT<0> to BLT<M−1>) of the sub-arrays 114(0) to 114(P−1). So, the true bit lines BLT$_i$<j>, for the j-th column and for i=0 to P−1 across the sub-arrays 114, are each coupled through a coupling circuit 120 to the global bit line GBL<j>. For example, the true bit lines BLT$_0$<0> to BLT$_{P-1}$<0> for the sub-arrays 114(0) to 114(P−1) are coupled by coupling circuits 120 to the global bit line GBL<0>. Similarly, the true bit lines BLT$_0$<M−1> to BLT$_{P-1}$<M−1> for the sub-arrays 114(0) to 114(P−1) are coupled by coupling circuits 120 to the global bit line GBL<M−1>. The global bit lines GBL<0> to GBL<M−1> extend parallel to the bit lines BL of the sub-arrays 114 across the array 112. The coupling circuits 120 are illustrated here as providing a capacitive coupling between the true bit lines BLT and the corresponding global bit line GBL. This capacitive coupling provided by the coupling circuits 120 may include a switch (not explicitly shown in FIG. 4A, but like switch S1 shown in FIGS. 7A, 9, and 11A, for example) which is selectively actuated to enable the capacitive coupling between the true bit line BLT and the global bit line GBL (this selective actuation could, for example, be dependent on bits FD of the feature data). In response to the capacitive coupling, an analog global output voltage $V_G$ develops on each global bit line GBL<j> that is an average of the local bit line voltages $V_L$ on the true bit lines BLT$_i$<j>, for i=0 to P−1 across the sub-arrays 114.

Although the illustrated example shows use of the true bit lines BLT<0> to BLT<M−1> of the 6T memory cells 14 being capacitively coupled to the global bit lines GBL, it will be understood that alternatively the complement bit lines BLC<0> to BLC<M−1> could instead be used. Still further, in the case with 8T memory cells 14 are instead used, it is the read bit lines BLR<0> to BLR<M−1> that would be capacitively coupled to the global bit lines GBL.

A capacitor Cg may be coupled between the global bit line GBL and a reference voltage (for example, ground) across which the analog global output voltage is stored. Alternatively, the capacitance of the global bit line GBL itself may be used. Although not shown in FIG. 4A, a switching circuit (reference S4) like that shown in FIG. 10A at reference S4 could be provided between each global bit line GBL and its associated capacitor Cg.

A computation circuit 122 coupled to each global bit line GBL (or to the associated capacitor Cg) includes an analog-to-digital converter (ADC) circuit operating to sample and convert the analog global output voltage $V_G$ on the global bit line GBL (or its associated capacitor Cg) to a digital value for the in-memory compute operation decision. The in-memory compute operation being performed is essentially a dot-product operation of the feature data and the weight data represented by the analog global output voltage $V_G$. The decision outputs Decision<0> through Decision<M−1> may be individually used or further combined in a subsequent digital signal processing (DSP) operation.

Figure 1:
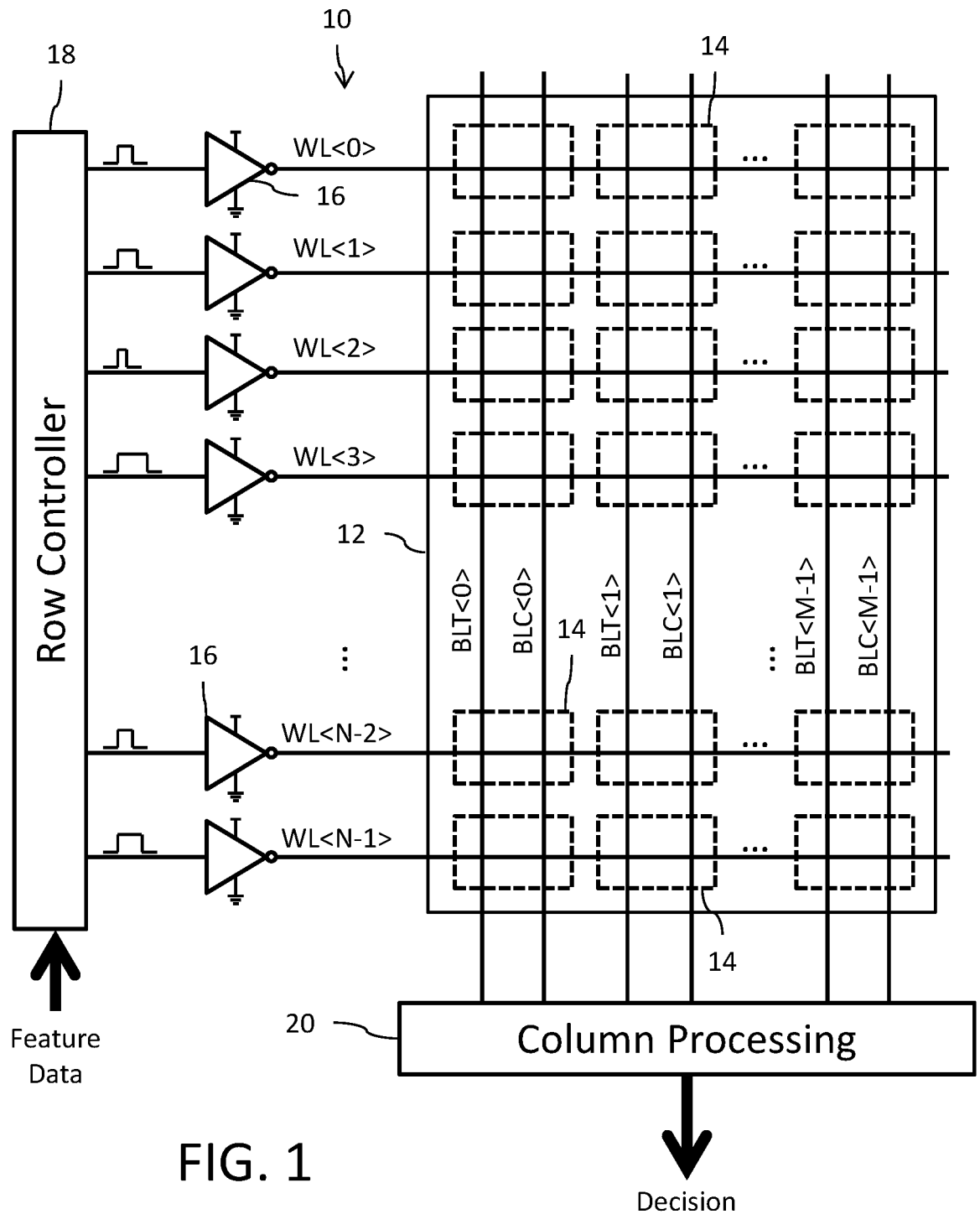
FIG. 1 is a schematic diagram of an in-memory computation circuit.
Figure 2:
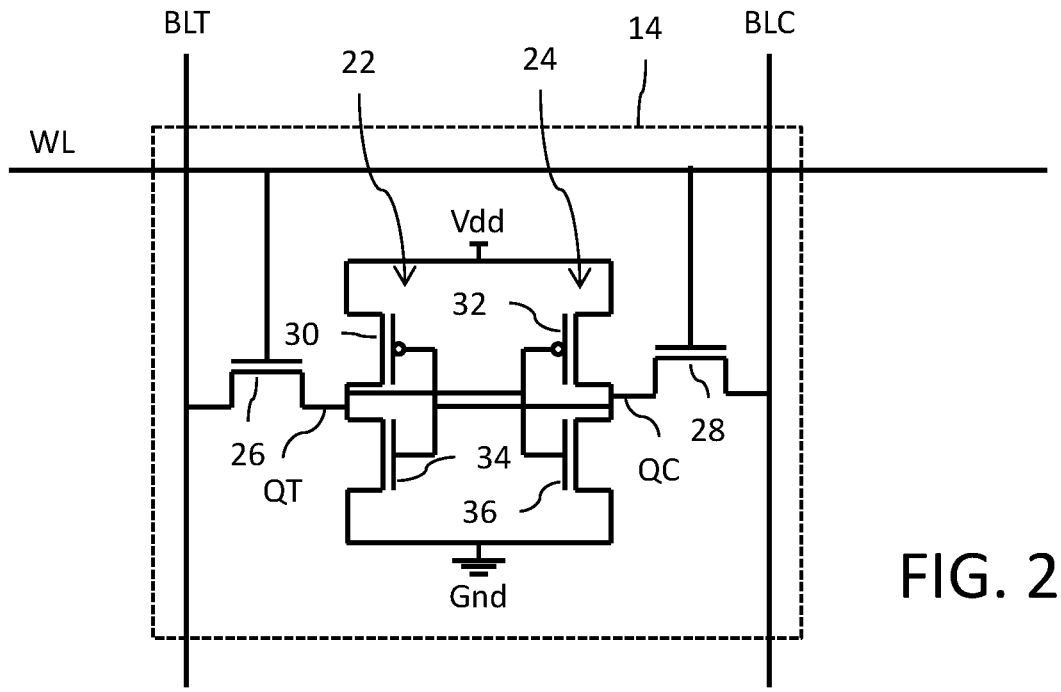
FIG. 2 is a circuit diagram of a standard 6T static random access memory (SRAM) cell as used the memory array of the in-memory computation circuit shown in FIG. 1.
Figure 3:
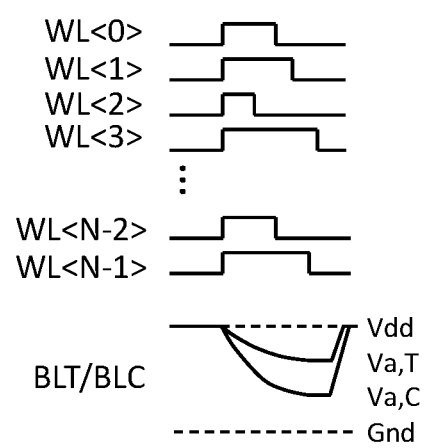
FIG. 3 is a timing diagram illustrating an in-memory compute operation.

In support of reducing power consumption, the 6T memory cells 14 can be configured with a split word line where a true word line is coupled to the gate of the access transistor 26 and a complement word line is coupled to the gate of the access transistor 28 (see, FIG. 2). For the in-memory compute operation, since the coupling circuit 220 is coupled to only the true bit line BLT, the row controller circuit 118 can selectively apply the word line signals to only the true word lines in connection with performing a read operation on the true side of the latch. As a result, there is only toggling performed on the true side of the latch (through the current sunk by transistor 34) and thus read power may be reduced by 50%.

Figure 4B:
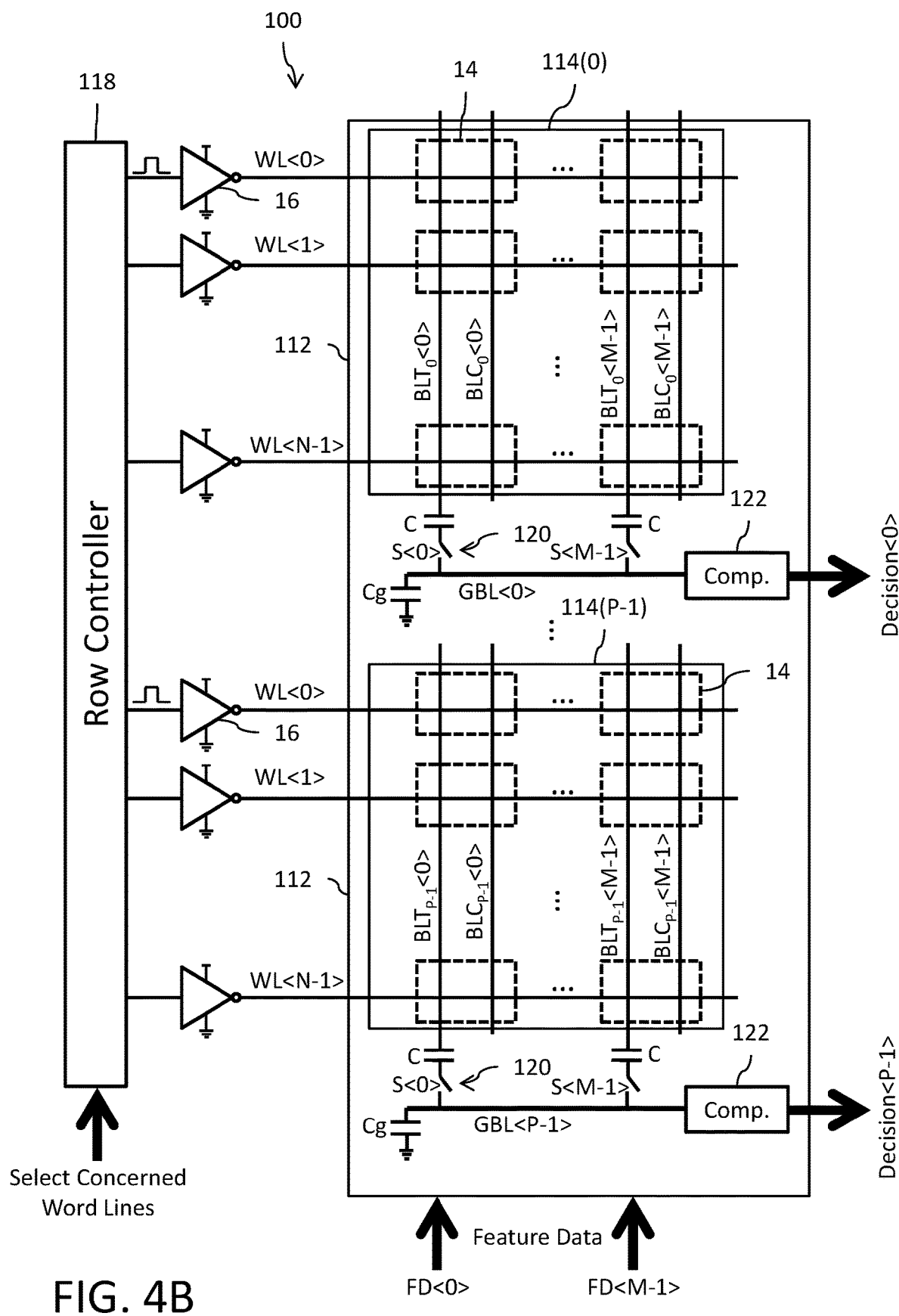
Figure 4C:
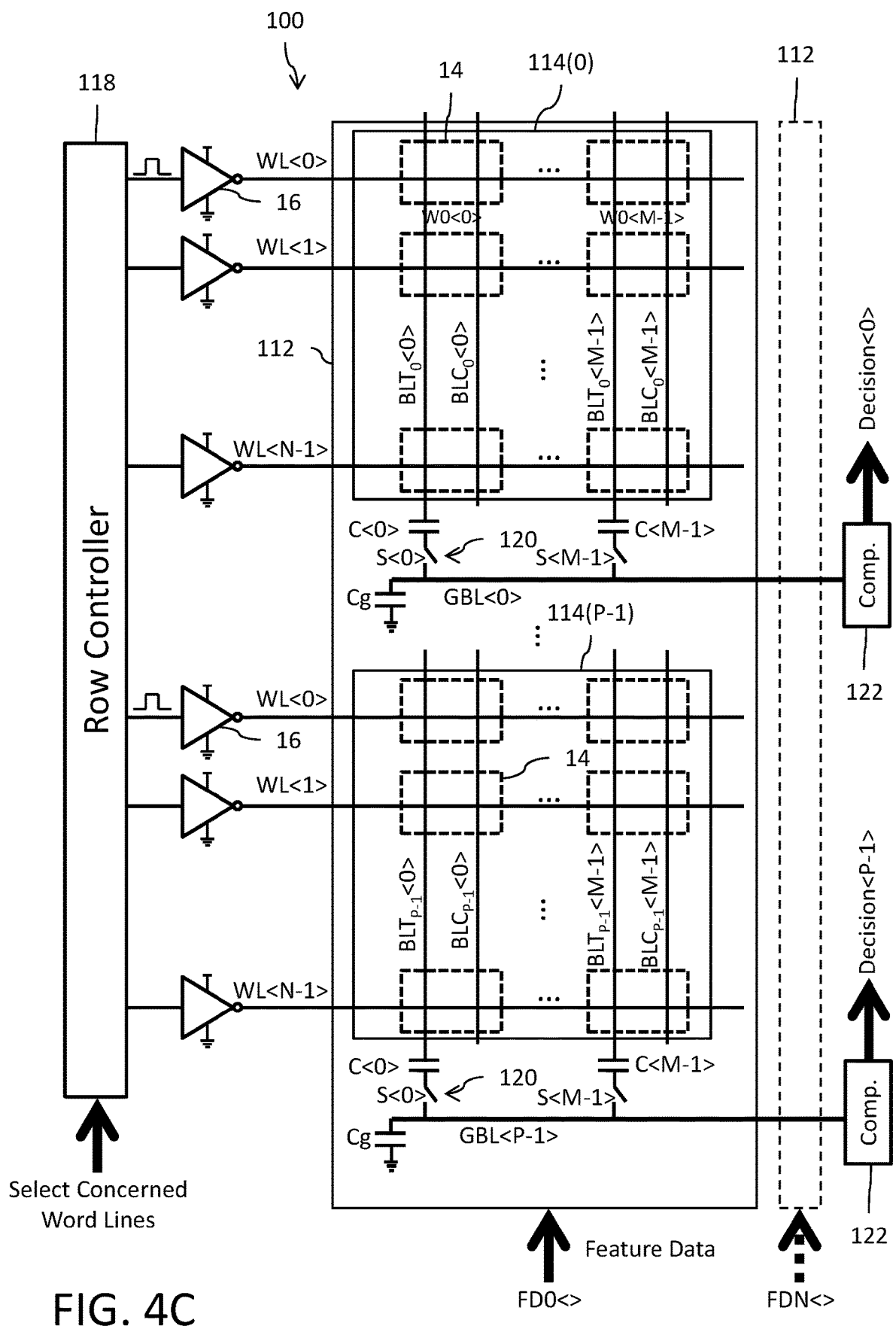
Figure 5A:
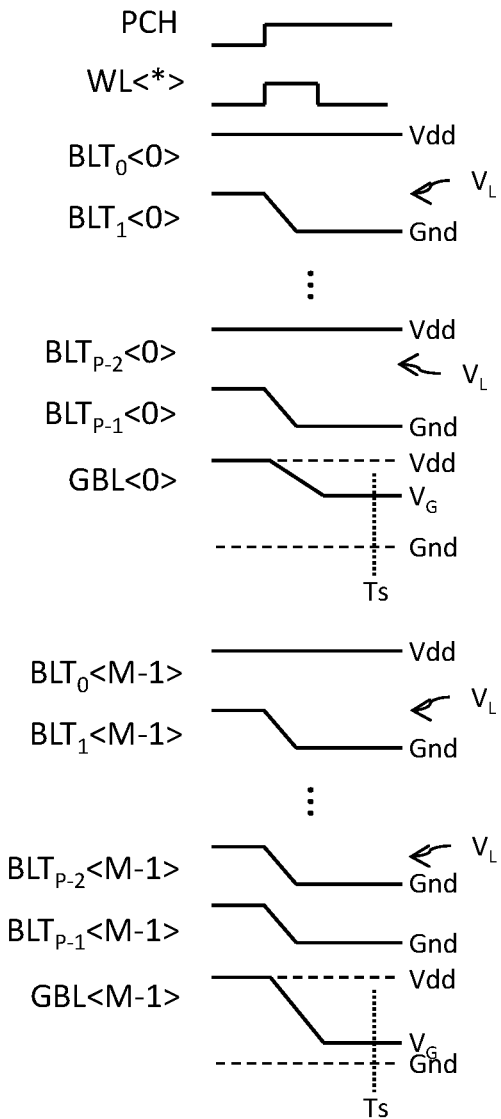
FIGS. 5A and 5B are timing diagram illustrating an in-memory compute operation.

Reference is now made to FIG. 5A which shows a timing diagram illustrating an in-memory compute operation using the circuit of FIG. 4A. In response to a pre-charge signal PCH, the voltages on the true bit lines BLT and global bit lines GBL are all charged to the supply voltage Vdd level. It will be noted that conventional bit line pre-charge circuitry (not explicitly shown) is coupled to the bit lines BL and GBL to effectuate this pre-charge operation. A plurality of word line signals WL<*> are applied to the sub-arrays 114(0) to 114(P−1) within the array 112. The "*" designation here means that plural word lines are being simultaneously driven by word line signals, but only one word line per sub-array 114 has been actuated dependent on the feature data (with the example of FIG. 4 showing that only the word lines WL<0> in each sub-array 114 are being simultaneously asserted). As a result, a read of the memory cells 14 is performed and local bit line voltages $V_L$ develop on each of the true bit lines BLT. Those voltages are dependent on the logic value of the weight bit stored in the memory cell 14 accessed by the asserted word line signals. In an embodiment, there is a full discharge of the true bit line BLT in response to the memory cell storing a logic 0 for the weight bit and the applied word line signal pulse. In response to the capacitive coupling between the true bit lines $BLT_0$<j> to $BLT_{P-1}$<j> and the global bit line GBL<j>, the analog global output voltage $V_G$ develops on the global bit line GBL<j> as an average of the local bit line voltages $V_L$. At a sampling time Ts, the ADC of the computation circuit 122 samples the analog global output voltage $V_G$ for conversion to the digital decision output (Decision<j>).

It will be noted from FIG. 4A that the global bit lines GBL are arranged to extend in a direction that is parallel with the columns in the sub-arrays 112. In an alternate embodiment, the global bit lines GBL can instead be arranged to extend in a direction that is parallel with the rows in the sub-arrays 112. This is shown in FIGS. 4B and 4C where like references in FIG. 4A refer to same or similar components, the description of which will not be repeated for sake of brevity. The array 112 includes a plurality of global bit lines GBL<0> to GBL<P−1> that are coupled through coupling circuits 120 to (local) bit lines (shown here, by example only, as the true bit lines BLT<0> to BLT<M−1>) of the sub-arrays 114(0) to 114(P−1). So, the true bit lines $BLT_i$<j>, where i is the sub-array index from 0 to P−1 and j is the column index from 0 to M−1, for the i-th sub-array 114, are each coupled through a coupling circuit 120 to the global bit line GBL<i>. For example, the true bit lines $BLT_0$<0> to $BLT_0$<M−1> for the sub-arrays 114(0) are coupled by coupling circuits 120 to the global bit line GBL<0>. Similarly, the true bit lines $BLT_{P-1}$<0> to $BLT_{P-1}$<M−1> for the sub-array 114(P−1) are coupled by coupling circuits 120 to the global bit line GBL<P−1>. The global bit lines GBL<0> to GBL<P−1> extend parallel to the rows of the sub-arrays 114 across the array 112.

The coupling circuits 120 are illustrated in FIGS. 4B and 4C as a series connection of a capacitor C and a switch S providing a selectively actuated capacitive coupling between each of the true bit lines BLT in a sub-array 114 and its corresponding global bit line GBL. In the FIG. 4B implementation, the capacitors C all have a same capacitance and the switches S<0> to S<M−1> are selectively actuated by bits FD<0> to FD<M−1>, respectively, of the feature data for the in-memory compute operation. However, in the FIG. 4C implementation, where support is being provided for use of multi-bit weight data (i.e., W0<0> to W0<M−1>) stored by a row of memory cells 14, the capacitors C<0> to C<M−1> have different capacitances, and in a preferred implementation those capacitances are weighted, and the switches S<0> to S<M−1> are selectively actuated by bits FD< > of the feature data for the in-memory compute operation. The capacitance of capacitor C<1> is, for example, two times the capacitance of the capacitor C<0>. In response to the selective capacitive coupling controlled by bits FD of the feature data, an analog global output voltage $V_G$ develops on each global bit line GBL<i> that is an average of the local bit line voltages $V_L$ on the true bit lines $BLT_i$<j>, for j=0 to M−1 across the sub-array 114<i>.

In the FIG. 4C implementation, multibit feature data (i.e., FD<0:N−1>) is managed in in bit-serial processing form over N cycles as schematically illustrated by the dotted replication of the array driven by feature data FD0< > for the first cycle and driven by feature data FDN< > for the N-th cycle.

Although the illustrated example shows use of the true bit lines BLT<0> to BLT<M−1> of the 6T memory cells 14 being capacitively coupled to the global bit line GBL for the sub-array 114, it will be understood that alternatively the complement bit lines BLC<0> to BLC<M−1> could instead be used. Still further, in the case with 8T memory cells 14 are instead used, it is the read bit lines BLR<0> to BLR<M−1> that would be capacitively coupled to the global bit line GBL for the sub-array 114.

A capacitor Cg may be coupled between each global bit line GBL and a reference voltage (for example, ground) across which the analog global output voltage is stored. Alternatively, the capacitance of the global bit line GBL itself may be used. Although not shown in FIGS. 4B and 4C, a switching circuit (reference S4) like that shown in FIG. 10A could be provided between each global bit line GBL and its associated capacitor Cg.

A computation circuit 122 coupled to each global bit line GBL (or its associated capacitor Cg) includes an analog-to-digital converter (ADC) circuit operating to sample and convert the analog global output voltage $V_G$ on the global bit line GBL (or its associated capacitor Cg) to a digital value for the in-memory compute operation decision. The in-memory compute operation being performed is essentially a dot-product operation of the feature data and the weight data represented by the analog global output voltage $V_G$. The decision outputs Decision<0> through Decision<P−1> may be individually used or further combined in a subsequent digital signal processing (DSP) operation.

Figure 5B:
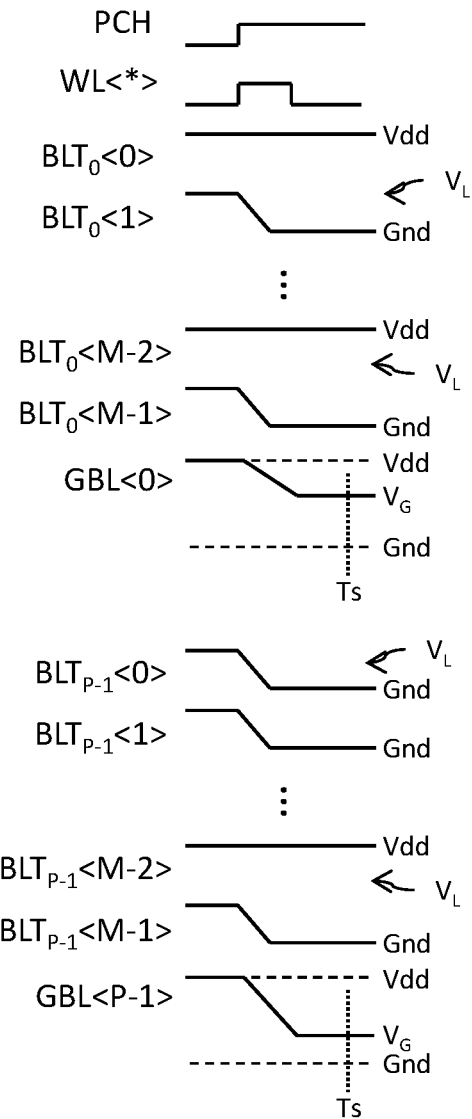

Reference is now made to FIG. 5B which shows a timing diagram illustrating an in-memory compute operation using the circuit of FIG. 4B or 4C. In response to a pre-charge signal PCH, the voltages on the true bit lines BLT and global bit lines GBL are all charged to the supply voltage Vdd level. It will be noted that conventional bit line pre-charge circuitry (not explicitly shown) is coupled to the bit lines BL and GBL to effectuate this pre-charge operation. A plurality of word line signals WL<*> are applied to the sub-arrays 114(0) to 114(P−1) within the array 112. The "*" designation here means that plural word lines are being simultaneously driven by word line signals (having a same pulse width), but only one word line per sub-array 114 has been actuated (with the example of FIG. 4 showing that only the word lines WL<0> in each sub-array 114 are being simultaneously asserted). The selection of the concerned word lines for the in-memory compute operation is made in response to a corresponding selection signal received by the row controller 118 which is dependent on the feature data. As a result, a read of the memory cells 14 is performed and local bit line voltages $V_L$ develop on each of the true bit lines BLT. Those voltages are dependent on the logic value of the weight bit stored in the memory cell 14 accessed by the asserted word line signals.

In an embodiment, there is a full discharge of the true bit line BLT in response to the memory cell storing a logic 0 for the weight bit and the applied word line signal pulse. In response to the selective capacitive coupling between the true bit lines $BLT_i<0>$ to $BLT_i<M-1>$ and the global bit line $GBL<i>$, where i is sub-array index from 0 to P−1, controlled by feature data bits FD<0> to FD<M−1> actuation of the switches S<0< to S<M−1>, the analog global output voltage $V_G$ develops on the global bit line GBL<i> as an average of the feature data selected local bit line voltages $V_L$. At a sampling time Ts, the ADC of the computation circuit 122 samples the analog global output voltage $V_G$ for conversion to the digital decision output (Decision<i>).

Timing of the switch actuation in connection with the implementation of FIGS. 4B and 4C is as follows: i) following or concurrent with application of the word line signal pulses, the local bit line voltages $V_L$ develop on the true bit lines BLT and the switches S are closed to transfer the local bit line voltages $V_L$ to the global bit line GBL; ii) an average of the local bit line voltages $V_L$ develops on the global bit line GBL (and/or its associated global capacitor Cg) as the analog global output voltage $V_G$ and the switches S are then opened. At this point, the resulting analog global output voltage $V_G$ is ready to be sampled (at time Ts) and converted by the computation circuit 122 to a digital signal representing the Decision output for the in-memory compute operation.

Figure 6A:
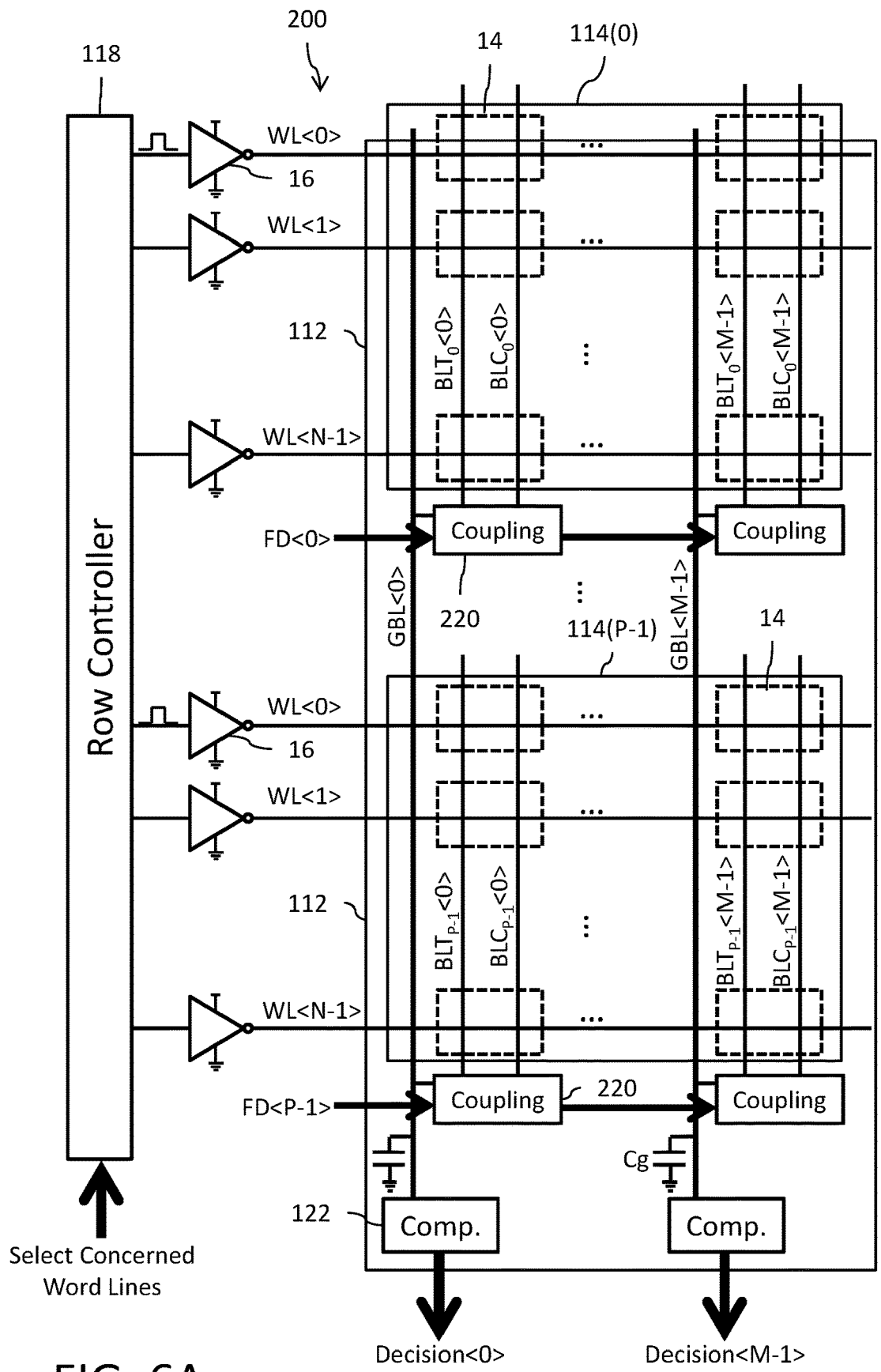
FIGS. 6A and 6B are schematic diagram of embodiments for an in-memory computation circuit.

Reference is now made to FIG. 6A which shows a schematic diagram of an in-memory computation circuit 200 which supports the use of multi-bit feature data. Like references in FIGS. 4A-4C and 6A refer to same or similar components, the description of which will not be repeated for sake of brevity. The circuit 200 differs from the circuit 100 in that the plurality of global bit lines GBL<0> to GBL<M−1> are coupled through coupling circuits 220 to corresponding bit lines (shown here, by example only, as the true bit lines BLT<0> to BLT<M−1>) of the sub-arrays 114(0) to 114(P−1). For example, the true bit lines $BLT_0<0>$ to $BLT_{P-1}<0>$ for the sub-arrays 114(0) to 114(P−1) are coupled by coupling circuits 220 to the global bit line GBL<0>. Similarly, the true bit lines $BLT_0<M-1>$ to $BLT_{P-1}<M-1>$ for the sub-arrays 114(0) to 114(P−1) are coupled by coupling circuits 220 to the global bit line GBL<M−1>. Additionally, bits FD of the feature data are applied to the coupling circuits 220 for the sub-arrays 114(0) to 114(P−1) such that the coupling operation is a function of the feature data bits FD. In an embodiment, the bits FD of the feature data (i.e., FD<0> through FD<P−1>) may be applied to the coupling circuits 220 associated with corresponding sub-arrays 114(0) through 114(P−1).

Figure 7A:
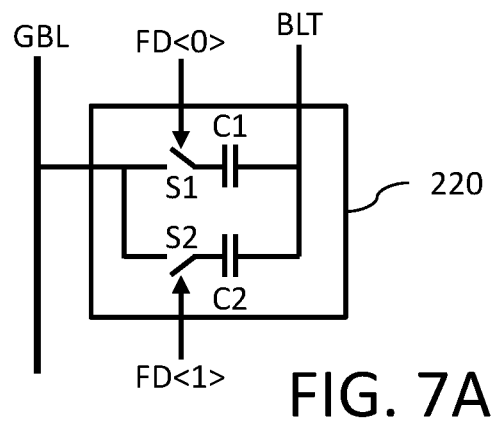
FIGS. 7A and 7B are circuit diagrams for embodiments of a coupling circuit used in the circuit of FIG. 6A.

Reference is now additionally made to FIG. 7A which shows a circuit diagram for an embodiment of the coupling circuit 220. The bit line BLT is coupled, preferably directly connected, to the first terminals of capacitor C1 and capacitor C2. The capacitors C1 and C2 have different capacitances, and in a preferred implementation those capacitances are weighted. The capacitance of capacitor C2 is, for example, two times the capacitance of the capacitor C1. The second terminal of capacitor C1 is coupled, preferably directly connected, to the first terminal of a first switch S1. A second terminal of the first switch is coupled, preferably directly connected, to the global bit line GBL. The control terminal of switch S1 receives a less significant bit FD<0> of the feature data. The second terminal of capacitor C2 is coupled, preferably directly connected, to the first terminal of a second switch S2. A second terminal of the second switch is coupled, preferably directly connected, to the global bit line GBL. The control terminal of switch S2 receives a more significant bit FD<1> of the feature data. Thus, in the case where the less significant bit FD<0> of the feature data is logic 1, switch S1 is actuated and the local bit line voltage $V_L$ is capacitively coupled through capacitor C1 to the global bit line GBL with a first level of charge sharing based on the capacitance of capacitor C1. Conversely, in the case where the more significant bit FD<1> of the feature data is logic 1, switch S2 is actuated and the local bit line voltage $V_L$ is capacitively coupled through capacitor C2 to the global bit line GBL with a second level of charge sharing based on the capacitance of capacitor C2 (for example, two times compared to the first level). In the case where both bits FD<0> and FD<1> are logic 0, neither switch S1 nor switch S2 are actuated and there is no capacitive coupling between the bit line BLT and the global bit line GBL. It will be noted that alternatively the switches S1, S2 can be positioned between the capacitors C1, C2 and the bit line BLT.

In a further enhancement, the row controller circuit 118 may monitor the bits FD<0> and FD<1> of the feature data. In response to the case where both bits FD<0> and FD<1> are logic 0, the row controller circuit 118 can control word line signal generation so that no word line signal will be generated for sub-array 114 for the in-memory compute operation. The advantage of this is that it will reduce power consumption by inhibiting unnecessary toggling of the memory cells 14 in a sub-array 114 where neither switch S1 nor switch S2 will be actuated.

In further support of reducing power consumption, the memory cells 14 can be configured with a split word line where a true word line is coupled to the gate of the access transistor 26 and a complement word line is coupled to the gate of the access transistor 28 (see, FIG. 2). For the in-memory compute operation, since the coupling circuit 220 is coupled to only the true bit line BLT, the row controller circuit 118 can selectively apply the word line signals to only the true word lines for a read operation on the true side of the latch. As a result, there is only toggling performed on the true side of the latch (through current sunk by transistor 34) and thus read power probability is reduced by 50%.

Operation of the circuit of FIGS. 6A and 7A is as shown in FIG. 5A except that the analog global output voltage $V_G$ develops on each global bit line GBL as a weighted average of the local bit line voltages, where the weighting is dependent on the logic states of the bits FD<0> and FD<1> of the feature data. Timing of the switch actuation is as follows: i) following or concurrent with application of the word line signal pulses, the local bit line voltages $V_L$ develop on the true bit lines BLT and the switches S1 and/or S2 are selectively closed in response to the logic state of the bits of the feature data FD<0> and FD<1> to transfer the weighted local bit line voltages $V_L$ to the global bit line GBL; ii) an average of the weighted local bit line voltages $V_L$ develops on the global bit line GBL (and/or its associated global capacitor Cg) as the analog global output voltage $V_G$ and the switches S1 and/or S2 are then opened. At this point, the resulting analog global output voltage $V_G$ is ready to be sampled (at time Ts) and converted by the computation circuit 122 to a digital signal representing the Decision output for the in-memory compute operation. The selection of the concerned word lines for the in-memory compute operation is made in response to a corresponding selection signal received by the row controller 118.

Figure 7B:
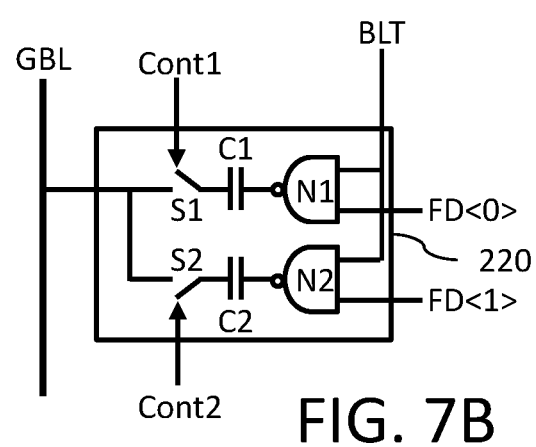

FIG. 7B shows a circuit diagram for an alternative embodiment of the coupling circuit 220. The bit line BLT is coupled, preferably directly connected, to the first inputs of logic NAND gates N1 and N2. The second input of NAND gate N1 receives a less significant bit FD<0> of the feature data. The second input of NAND gate N2 receives a more significant bit FD<1> of the feature data. The NAND gate functions to logically combine the logic state on the bit line BLT with the logic state of the feature data bit FD. The output of the NAND gate N1 is coupled, preferably directly connected, to the first terminal of a capacitor C1. The output of the NAND gate N2 is coupled, preferably directly connected, to the first terminal of a capacitor C2. The capacitors C1 and C2 have different capacitances, and in a preferred implementation those capacitances are weighted. The capacitance of capacitor C2 is, for example, two times the capacitance of the capacitor C1. The second terminal of capacitor C1 is coupled, preferably directly connected, to the first terminal of a first switch S1. A second terminal of the first switch is coupled, preferably directly connected, to the global bit line GBL. The control terminal of switch S1 receives a first control signal Cont1 (which may, for example, be the less significant bit FD<0> of the feature data, some other timing control signal, or a logical combination of the bit FD<0> with a control signal). The second terminal of capacitor C2 is coupled, preferably directly connected, to the first terminal of a second switch S2. A second terminal of the second switch is coupled, preferably directly connected, to the global bit line GBL. The control terminal of switch S2 receives a second control signal Cont2 (which may, for example, be the more significant bit FD<1> of the feature data, some other timing control signal, or a logical combination of the bit FD<1> with a control signal). Thus, in the case where the first control signal Cont1 is asserted (for example, logic 1), switch S1 is actuated and the voltage corresponding to the logic state at the output of the NAND gate N1 (logically combining the bit line and FD<0>) is capacitively coupled through capacitor C1 to the global bit line GBL with a first level of charge sharing based on the capacitance of capacitor C1. Conversely, in the case where the second control signal Cont2 is asserted (for example, logic 1), switch S2 is actuated and the voltage corresponding to the logic state at the output of the NAND gate N2 (logically combining the bit line and FD<1>) is capacitively coupled through capacitor C2 to the global bit line GBL with a second level of charge sharing based on the capacitance of capacitor C2 (for example, two times compared to the first level).

It will be noted that use of NAND logic gating is just an example and that any suitable logical combination circuit could alternatively be used (for example, an XOR logic gate) for combining the logic states of the bit line BLT and feature data bit FD. Alternatively, the switches S1, S2 could be positioned between the capacitors C1, C2 and the logic gates N1, N2; or positioned between the logic gates N1, N2 and the bit line BLT.

Operation of the circuit of FIGS. 6A and 7B is as shown in FIG. 5A except that the analog global output voltage $V_G$ develops on each global bit line GBL as a weighted average NAND gate output voltages, where the weighting is dependent on the logic states of the bits FD<0> and FD<1> of the feature data. Timing of the switch actuation is as follows: i) following or concurrent with application of the word line signal pulses, the local bit line voltages $V_L$ develop on the true bit lines BLT and are logically combined with the logic state of the bits of the feature data FD<0> and FD<1>; ii) switches S1 and/or S2 are selectively closed in response to the logic state of the control signals Cont1 and Cont2 (corresponding to the bits of the feature data FD<0> and FD<1>) to transfer the weighted local bit line voltages $V_L$ to the global bit line GBL; iii) an average of the weighted local bit line voltages $V_L$ develops on the global bit line GBL (and/or its associated global capacitor Cg) as the analog global output voltage $V_G$ and the switches S1 and/or S2 are then opened. At this point, the resulting analog global output voltage $V_G$ is ready to be sampled (at time Ts) and converted by the computation circuit 122 to a digital signal representing the Decision output for the in-memory compute operation. The selection of the concerned word lines for the in-memory compute operation is made in response to a corresponding selection signal received by the row controller 118. Alternatively, the closing of the switches S1 and/or S2 may be made prior to word line actuation.

Figure 6B:
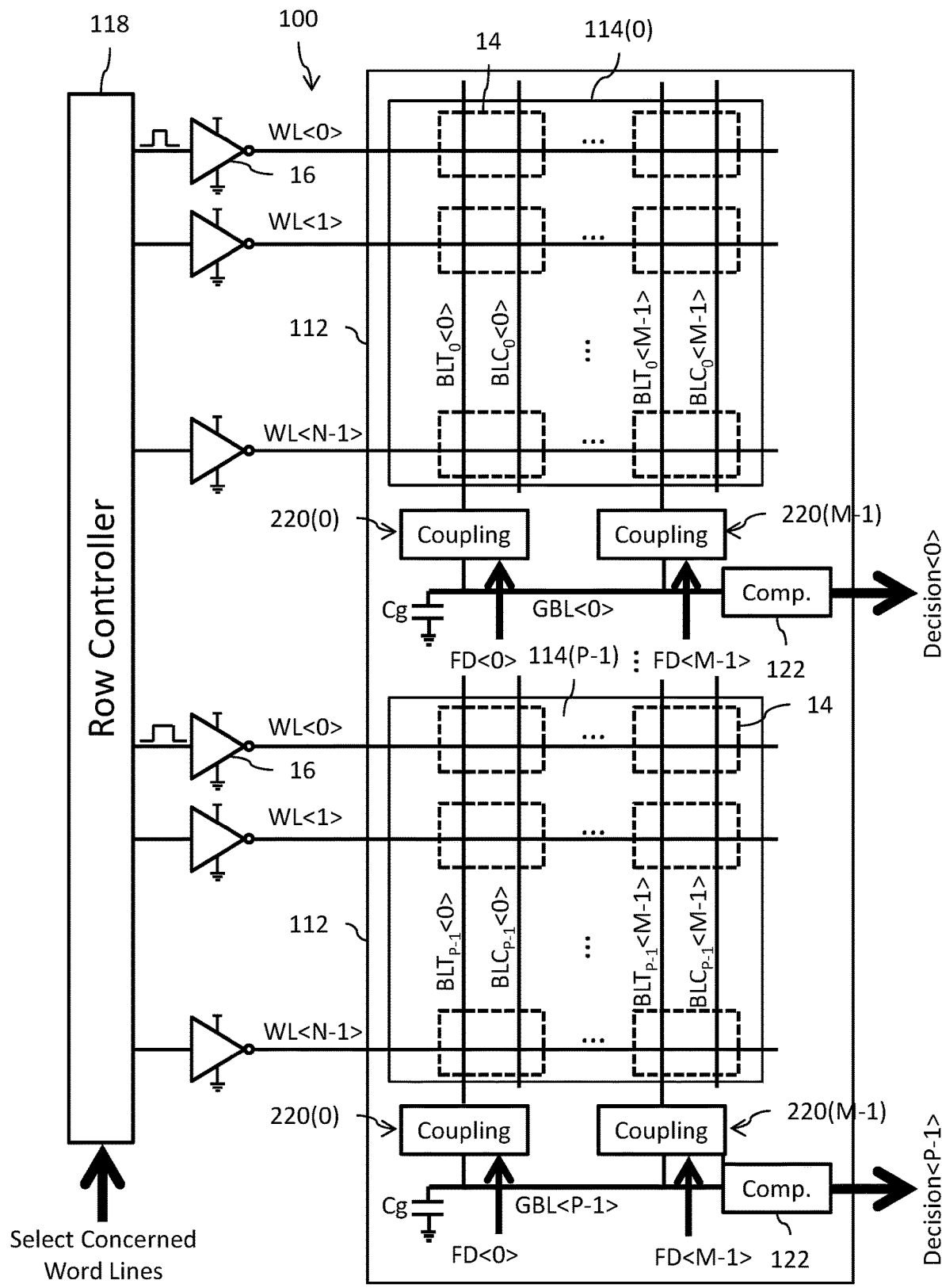

It will be noted from FIG. 6A that the global bit lines GBL are arranged to extend in a direction that is parallel with the columns in the sub-arrays 112. In an alternate embodiment, the global bit lines GBL can instead be arranged to extend in a direction that is parallel with the rows in the sub-arrays 112. This is shown in FIG. 6B where like references in FIG. 6A refer to same or similar components, the description of which will not be repeated for sake of brevity. The array 112 includes a plurality of global bit lines GBL<0> to GBL<P−1> that are coupled through coupling circuits 220 to corresponding (local) bit lines (shown here, by example only, as the true bit lines BLT<0> to BLT<M−1>) of the sub-arrays 114(0) to 114(P−1). So, the true bit lines $BLT_i$<j>, where i is the sub-array index from 0 to P−1 and j is the column index from 0 to M−1, for the i-th sub-array 114, are each coupled through a coupling circuit 220 to the global bit line GBL<i>. For example, the true bit lines $BLT_0$<0> to $BLT_0$<M−1> for the sub-array 114(0) are coupled by coupling circuits 220 to the global bit line GBL<0>. Similarly, the true bit lines $BLT_{P-1}$<0> to $BLT_{P-1}$<M−1> for the sub-array 114(P−1) are coupled by coupling circuits 220 to the global bit line GBL<P−1>. The global bit lines GBL<0> to GBL<P−1> extend parallel to the rows of the sub-arrays 114 across the array 112. Additionally, bits FD of the feature data are applied to the coupling circuits 220 for the sub-arrays 114(0) to 114(P−1) such that the coupling operation is a function of the feature data bits FD. In an embodiment, the bits FD of the feature data (i.e., FD<0> through FD<M−1>) may be applied to the coupling circuits 220(0) through 220(M−1) in each of the sub-arrays 114(0) through 114(P−1) associated with a corresponding column.

The coupling circuits 220 may, for example, each have a circuit configuration as shown in FIG. 7A or 7B. Operation of the circuit of FIGS. 6B and 7A is as shown in FIG. 5B and further described in connection with FIGS. 6A and 7A. Likewise, operation of the circuit of FIGS. 6B and 7B is as shown in FIG. 5B and further described in connection with FIGS. 6A and 7B.

Figure 8:
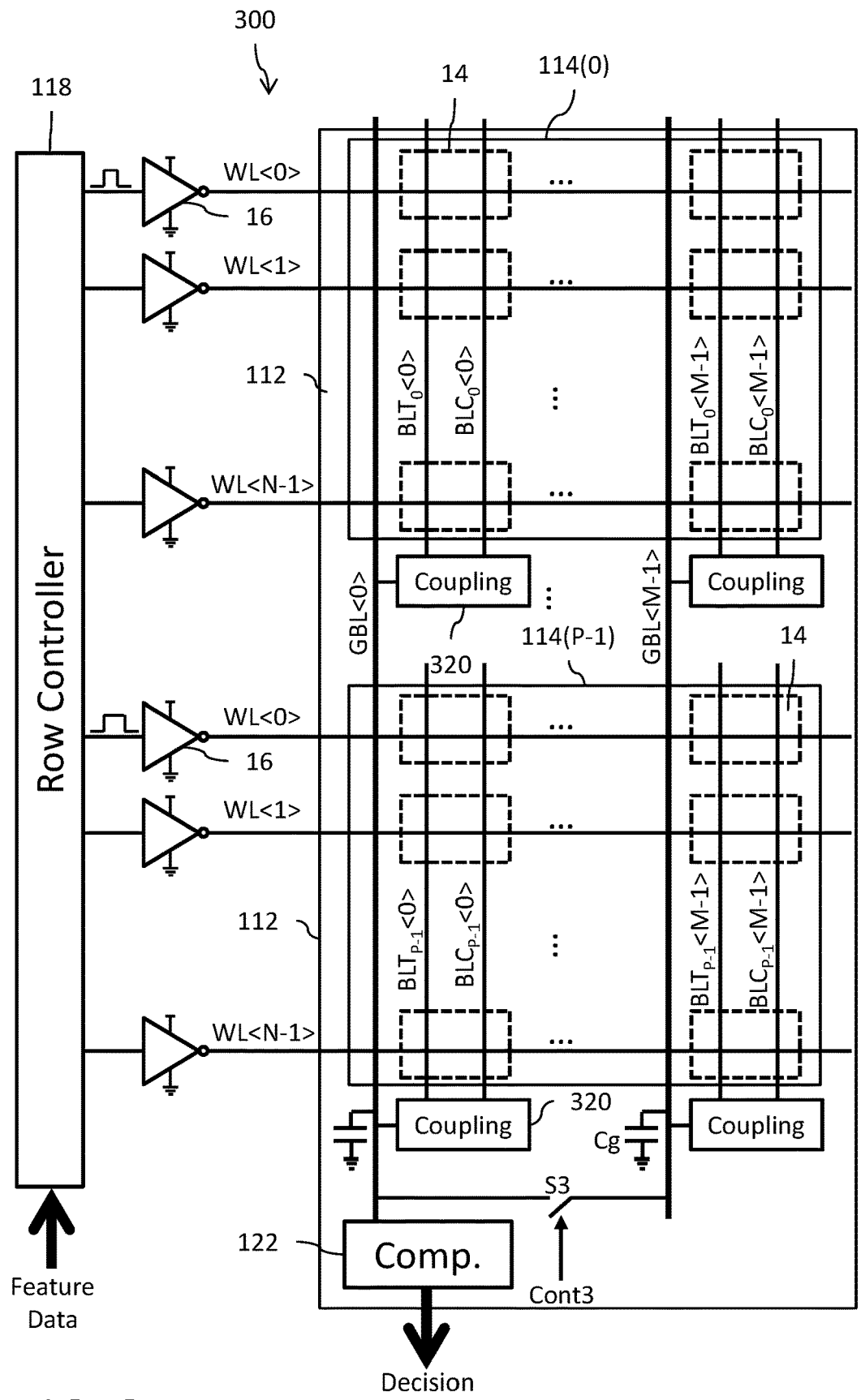
FIG. 8 is a schematic diagram of an in-memory computation circuit.

Reference is now made to FIG. 8 which shows a schematic diagram of an in-memory computation circuit 300 which supports the use of multi-bit weight data. Like references in FIGS. 4A-4C, 6A-6B and 8 refer to same or similar components, the description of which will not be repeated for sake of brevity. The circuit 300 differs from the circuits 100 and 200 in that multi-bit weight data is stored by plural memory cells 14 along each row of the sub-array 114. The circuit 300 further differs from the circuits 100 and 200 in that the plurality of global bit lines GBL<0> to GBL<M−1> are coupled through coupling circuits 320 to corresponding bit lines (shown here, by example only, as the true bit lines BLT<0> to BLT<M−1>) of the sub-arrays 114(0) to 114(P−1). For example, the true bit lines $BLT_0$<0> to $BLT_{P-1}$<0> for the sub-arrays 114(0) to 114(P−1) are coupled by coupling circuits 320 to the global bit line GBL<0>. Similarly, the true bit lines BLT$_0$<M−1> to BLT$_{P-1}$<M−1> for the sub-arrays 114(0) to 114(P−1) are coupled by coupling circuits 320 to the global bit line GBL<M−1>. Additionally, the circuit 300 includes a switch S3 which selectively couples all global bit lines GBL<0> to GBL<M−1> together in response to a control signal Cont3. Lastly, it will be noted that the computation circuit 122 is coupled through switch S3 to all the global bit lines GBL<0> to GBL<M−1>. Reference is now additionally made to FIG. 9 which shows a circuit diagram for each of the coupling circuit 320 coupled to the bit lines BLT of a sub-array 114. The bit lines BLT<0> to BLT<M−1> are coupled, preferably directly connected, to the first terminals of capacitors C<0> to C<M−1>, respectively. The capacitors C<0> to C<M−1> have different capacitances, and in a preferred implementation those capacitances are weighted. For example, the capacitance of capacitor C<1> is two times the capacitance of the capacitor C<0>. The second terminal of each capacitor C is coupled, preferably directly connected, to the first terminal of a switch S1. A second terminal of each switch S1 is coupled, preferably directly connected, to the global bit line GBL. The control terminal of switch S1 receives a control signal Cont1 that is asserted to close switch S1 during the in-memory compute operation. The control signals Cont1 may, in an embodiment, comprise bits FD of the feature Data for the in-memory compute operation (applied, for example, as shown in FIG. 6A). In response thereto, there are different levels of charge sharing between a bit line BLT and the global bit line GBL dependent on the capacitance of the capacitor C in the circuit 320. For example, there will be a first level of charge sharing between bit line BLT<0> and global bit line GBL<0> and a second level of charge sharing between bit line BLT<1> and global bit line GBL<1> that is two times the first level of charge sharing in the case where the capacitance of capacitor C<1> is twice the capacitance of capacitor C<1> depending on the significance of the bit in the multi-bit weight data.

In support of reducing power consumption, the memory cells 14 can be configured with a split word line where a true word line is coupled to the gate of the access transistor 26 and a complement word line is coupled to the gate of the access transistor 28 (see, FIG. 2). For the in-memory compute operation, since the coupling circuit 320 is coupled to only the true bit line BLT, the row controller circuit 118 can selectively apply the word line signals to only the true word lines for a read operation on the true side of the latch. As a result, there is only toggling performed on the true side of the latch (through current sunk by transistor 34) and thus read power probability is reduced by 50%.

Figure 9:
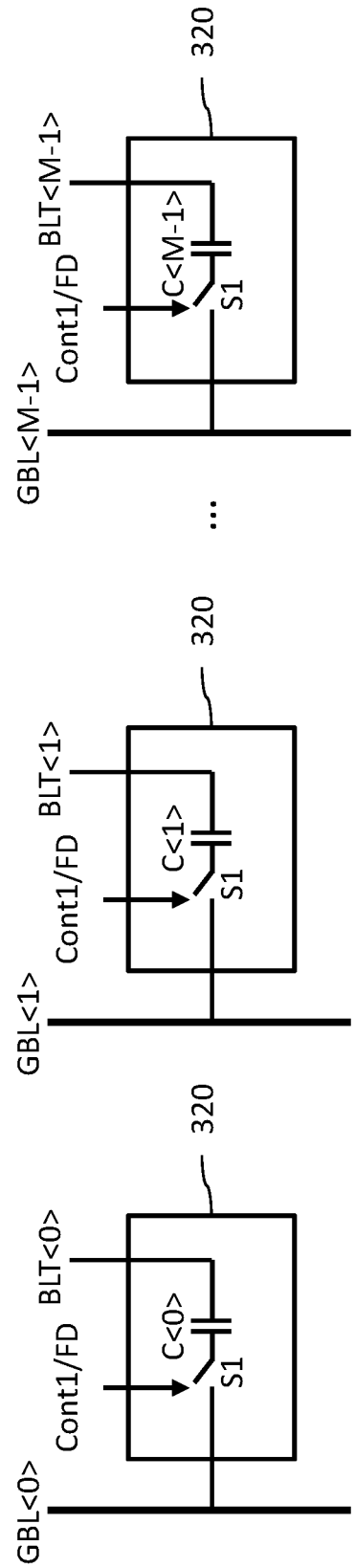
FIG. 9 is a circuit diagram for an embodiment of a coupling circuit used in the circuit of FIG. 8.

Operation of the circuit of FIGS. 8 and 9 is as shown in FIG. 5A except that the analog global output voltage $V_G$ develops as a weighted average of the voltages on plural ones of the global bit lines GBL, where the weighting is dependent on the logic states of the multiple bits of the weight data. Timing of the switch actuation is as follows: i) following or concurrent with application of the word line signal pulses dependent on the feature data, and with the switch S3 open, the local bit line voltages $V_L$ develop on the true bit lines BLT and the switches S1 are closed in response control signal Cont1 to transfer the local bit line voltages $V_L$ to respective global bit lines GBL; ii) an average of the local bit line voltages $V_L$ develops on each global bit line GBL (and/or its associated global capacitor Cg) as a respective analog global output voltage $V_G$; iii) the switches S1 are then opened and the switch S3 is closed in response control signal Cont3, and an average of the weighted analog global output voltages $V_G$ for all of the global bit lines develops on the global bit lines GBL (and/or the associated global capacitors Cg). At this point, the resulting averaged analog global output voltage $V_G$ is ready to be sampled (at time Ts) and converted by the computation circuit 122 to a digital signal representing the Decision output for the in-memory compute operation. Alternatively, the actuation of the switches S1 can be made prior to assertion of the word line signals.

Figure 10A:
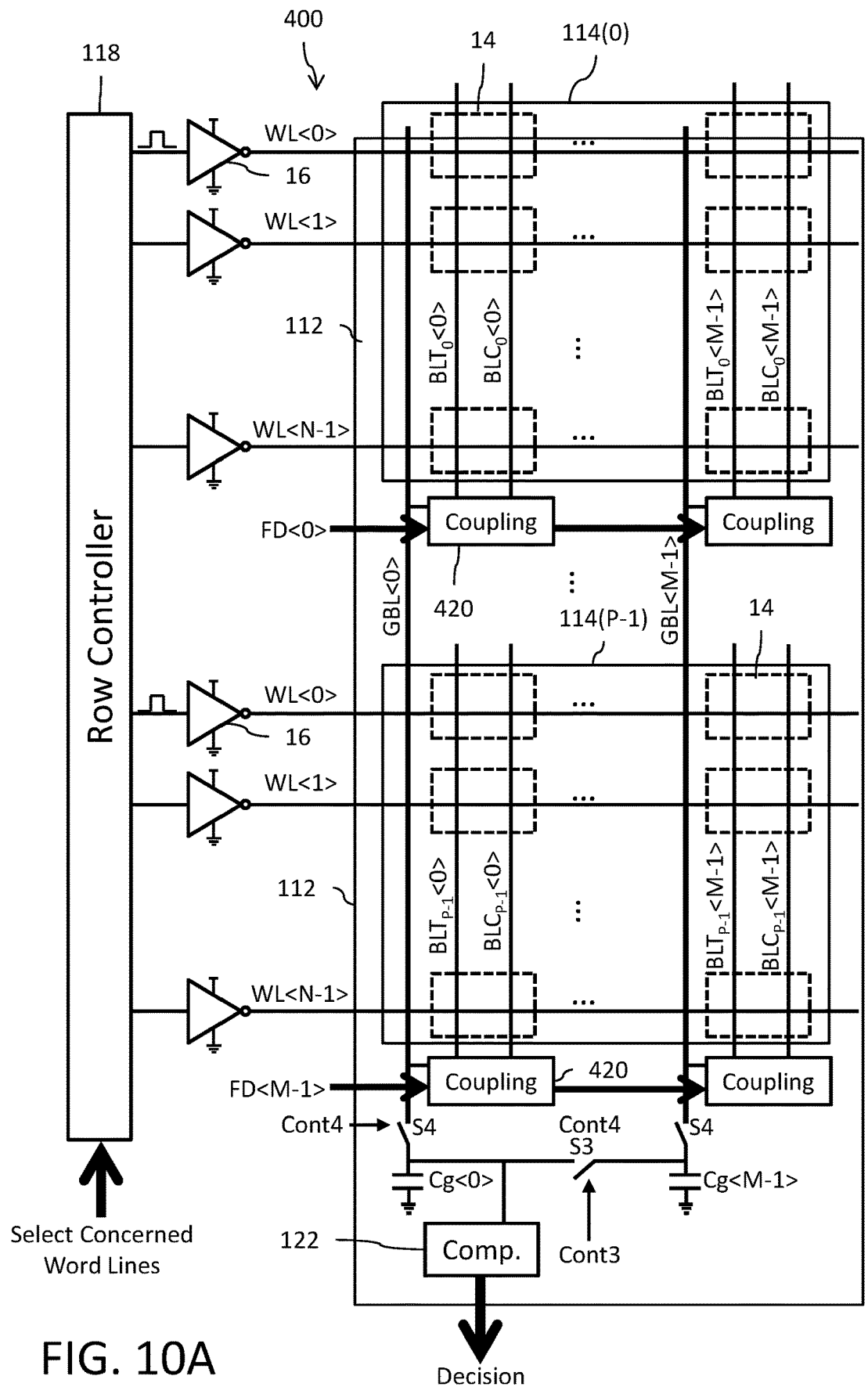
FIGS. 10A and 10B are schematic diagrams of an in-memory computation circuit.

Reference is now made to FIG. 10A which shows a schematic diagram of an in-memory computation circuit 400 which supports the use of multi-bit feature data and multi-bit weight data. Like references in FIGS. 4A-4C, 6A-6B, 8 and 10A refer to same or similar components, the description of which will not be repeated for sake of brevity. The circuit 400 differs from the circuits 100, 200 and 300 in a number of ways. First, multi-bit weight data is stored by plural memory cells 14 along each row of the sub-array 114. Second, the plurality of global bit lines GBL<0> to GBL<M−1> are coupled through coupling circuits 420 to corresponding bit lines (shown here, by example only, as the true bit lines BLT<0> to BLT<M−1>) of the sub-arrays 114(0) to 114(P−1). For example, the true bit lines BLT0<0> to BLTP−1<0> for the sub-arrays 114(0) to 114(P−1) are coupled by coupling circuits 420 to the global bitline GBL<0>. Similarly, the true bit lines BLT0<M−1> to BLTP−1<M−1> for the sub-arrays 114(0) to 114(P−1) are coupled by coupling circuits 420 to the global bit line GBL<M−1>. Third, each global bit line GBL is coupled through a switch S4 to the first terminal of a corresponding global capacitor Cg in response to a control signal Cont3. The second terminals of the global capacitors Cg are coupled, preferably directly connected, to a reference voltage (ground). The capacitors Cg<0> to Cg<M−1> have different capacitances, and in a preferred implementation those capacitances are weighted. Fourth, the circuit 400 includes a switch S3 which selectively couples the first terminals of all global capacitors Cg<0> to Cg<M−1> together in response to a control signal Cont3. Fifth, the computation circuit 122 is coupled through the switch S3 to all the global capacitors Cg<0> to Cg<M−1>. Lastly, bits FD of the feature data are applied to the coupling circuits 420 for the sub-arrays 114(0) to 114(P−1) such that the coupling operation is a function of the feature data bits FD. In an embodiment, the bits FD of the feature data (i.e., FD<0> through FD<P−1>) may be applied to the coupling circuits 420 associated with corresponding sub-arrays 114(0) through 114(P−1).

Reference is now additionally made to FIG. 11A which shows a circuit diagram for each of the coupling circuits 420 coupled to the bit lines BLT of a sub-array 114. The bit lines BLT<0> to BLT<M−1> are coupled, preferably directly connected, to the first terminals of capacitors C1<0> to C1<M−1>, respectively, and are further coupled, preferably directly connected, to the first terminals of capacitors C2<0> to C2<M−1>, respectively. The capacitors C1<0> to C1<M−1> have different capacitances, and in a preferred implementation those capacitances are weighted. Likewise, the capacitors C2<0> to C2<M−1> have different capacitances, and in a preferred implementation those capacitances are weighted. For example, the capacitance of capacitor C1<1>, respectively C2<1>, is two times the capacitance of the capacitor C1<0>, respectively C2<0>. Furthermore, there is a weighted relationship between the capacitors C1<0> to C1<M−1> and the capacitors C2<0> to C2<M−1>. For example, the capacitance of capacitor C2<0> is two times the capacitance of the capacitor C1<0>. The second terminal of each capacitor C1 is coupled, preferably directly connected, to the first terminal of a first switch S1. A second terminal of the first switch is coupled, preferably directly connected, to the global bit line GBL. The control terminal of switch S1 receives a less significant bit FD<0> of the feature data. The second terminal of each capacitor C2 is coupled, preferably directly connected, to the first terminal of a second switch S2. A second terminal of the second switch is coupled, preferably directly connected, to the global bit line GBL. The control terminal of switch S2 receives a more significant bit FD<1> of the feature data. Thus, in the case where the less significant bit FD<0> of the feature data is logic 1, switch S1 is actuated and the local bit line voltage $V_L$ is capacitively coupled through capacitor C1 to the global bit line GBL with a first level of charge sharing based on the capacitance of capacitor C1. Conversely, in the case where the more significant bit FD<1> of the feature data is logic 1, switch S2 is actuated and the local bit line voltage $V_L$ is capacitively coupled through capacitor C2 to the global bit line GBL with a second level of charge sharing based on the capacitance of capacitor C2 (for example, two times compared to the first level). In the case where both bits FD<0> and FD<1> are logic 0, neither switch S1 nor switch S2 are actuated.

Operation of the circuit of FIGS. 10A and 11A is as shown in FIG. 5A except that the analog global output voltage $V_G$ develops on the global bit line GBL as: a) a weighted average of the local bit line voltages, where the weighting is dependent on the logic states of the bits FD<0> and FD<1> of the feature data and b) a weighted average of the voltages on plural ones of the global bit lines GBL, where the weighting is dependent on the logic states of the multiple bits of the weight data. Timing of the switch actuation is as follows: i) following or concurrent with application of the word line signal pulses, and with the switches S3 and S4 open, the local bit line voltages $V_L$ develop on the true bit lines BLT and the switches S1 and/or S2 are selectively closed in response to the logic state of the bits of the feature data FD<0> and FD<1> to transfer the weighted local bit line voltages $V_L$ to the global bit line GBL; ii) the switches S1 and/or S2 are then opened and the switches S4 are closed in response to assertion of the control signal Cont4, and an average of the weighted local bit line voltages $V_L$ on the true bit lines BLT develops on the global capacitors Cg<0> to Cg<M-1>; iii) the switches S4 are then opened and the switch S3 is closed in response control signal Cont3, and an average of the weighted analog global output voltages $V_G$ develops on the global capacitors Cg<0> to Cg<M-1>. At this point, the resulting averaged analog global output voltage $V_G$ is ready to be sampled (at time Ts) and converted by the computation circuit 122 to a digital signal representing the Decision output for the in-memory compute operation. Actuation of the switches S1, S2 could instead be performed prior to assertion of the word line signals.

FIG. 11B shows a circuit diagram for an alternative embodiment for each of the coupling circuits 420 coupled to the bit lines BLT of a sub-array 114. The bit lines BLT<0> to BLT<M-1> are coupled, preferably directly connected, to the first inputs of logic NAND gates N1<0> to N1<M-1>, respectively, and are further coupled, preferably directly connected, to the first inputs of logic NAND gates N2<0> to N2<M-1>, respectively. The second inputs of the NAND gates N1 receive a less significant bit FD<0> of the feature data. The second input of NAND gates N2 receives a more significant bit FD<1> of the feature data. The NAND gates function to logically combine the logic state on the bit line BLT with the logic state of the feature data bit FD. The output of the NAND gates N1<0> to N1<M-1> are coupled, preferably directly connected, to the first terminals of capacitors C1<0> to C1<M-1>, respectively. The output of the NAND gates N2<0> to N2<M-1> are coupled, preferably directly connected, to the first terminals of capacitors C2<0> to C2<M-1>, respectively. The capacitors C1<0> to C1<M-1> have different capacitances, and in a preferred implementation those capacitances are weighted. Likewise, the capacitors C2<0> to C2<M-1> have different capacitances, and in a preferred implementation those capacitances are weighted. For example, the capacitance of capacitor C1<1>, respectively C2<1>, is two times the capacitance of the capacitor C1<0>, respectively C2<0>. Furthermore, there is a weighted relationship between the capacitors C1<0> to C1<M-1> and the capacitors C2<0> to C2<M-1>. For example, the capacitance of capacitor C2<0> is two times the capacitance of the capacitor C1<0>. The second terminal of each capacitor C1 is coupled, preferably directly connected, to the first terminal of a first switch S1. A second terminal of the first switch is coupled, preferably directly connected, to the global bit line GBL. The control terminal of switch S1 receives a first control signal Cont1 (which may, for example, be the less significant bit FD<0> of the feature data). The second terminal of each capacitor C2 is coupled, preferably directly connected, to the first terminal of a second switch S2. A second terminal of the second switch is coupled, preferably directly connected, to the global bit line GBL. The control terminal of switch S2 receives a second control signal Cont2 (which may, for example, be the more significant bit FD<1> of the feature data). Thus, in the case where the first control signal Cont1 is asserted (for example, logic 1), switch S1 is actuated and the voltage corresponding to the logic state at the output of the NAND gate N1 (logically combining the bit line and FD<0>) is capacitively coupled through capacitor C1 to the global bit line GBL with a first level of charge sharing based on the capacitance of capacitor C1. Conversely, in the case where the second control signal Cont2 is asserted (for example, logic 1), switch S2 is actuated and the voltage corresponding to the logic state at the output of the NAND gate N2 (logically combining the bit line and FD<1>) is capacitively coupled through capacitor C2 to the global bit line GBL with a second level of charge sharing based on the capacitance of capacitor C2 (for example, two times compared to the first level).

Operation of the circuit of FIGS. 10A and 11B is as shown in FIG. 5A except that the analog global output voltage $V_G$ develops on the global bit line GBL as: a) a weighted average of the local bit line voltages, where the weighting is dependent on the logic states of the bits FD<0> and FD<1> of the feature data and b) a weighted average of the voltages on plural ones of the global bit lines GBL, where the weighting is dependent on the logic states of the multiple bits of the weight data. Timing of the switch actuation is as follows: i) following or concurrent with application of the word line signal pulses, and with the switches S3 and S4 open, the local bit line voltages $V_L$ develop on the true bit lines BLT and are logically combined with the logic state of the bits of the feature data FD<0> and FD<1>; ii) switches S1 and/or S2 are selectively closed in response to the logic state of the control signals Cont1 and Cont2 (corresponding to the bits of the feature data FD<0> and FD<1>) to transfer the weighted local bit line voltages $V_L$ to the global bit line GBL; iii) the switches S1 and/or S2 are then opened and the switches S4 are closed in response to assertion of the control signal Cont4, and an average of the weighted local bit line voltages $V_L$ on the true bit lines BLT develops on the global capacitors Cg<0> to Cg<M-1>; iv) the switches S4 are then opened and the switch S3 is closed in response control signal Cont3, and an average of the weighted analog global output voltages $V_G$ develops on the global capacitors Cg<0> to Cg<M-1>. At this point, the resulting averaged analog global output voltage $V_G$ is ready to be sampled (at time Ts) and converted by the computation circuit 122 to a digital signal representing the Decision output for the in-memory compute operation. Actuation of the switches S1, S2 could instead be performed prior to assertion of the word line signals.

Figure 10B:
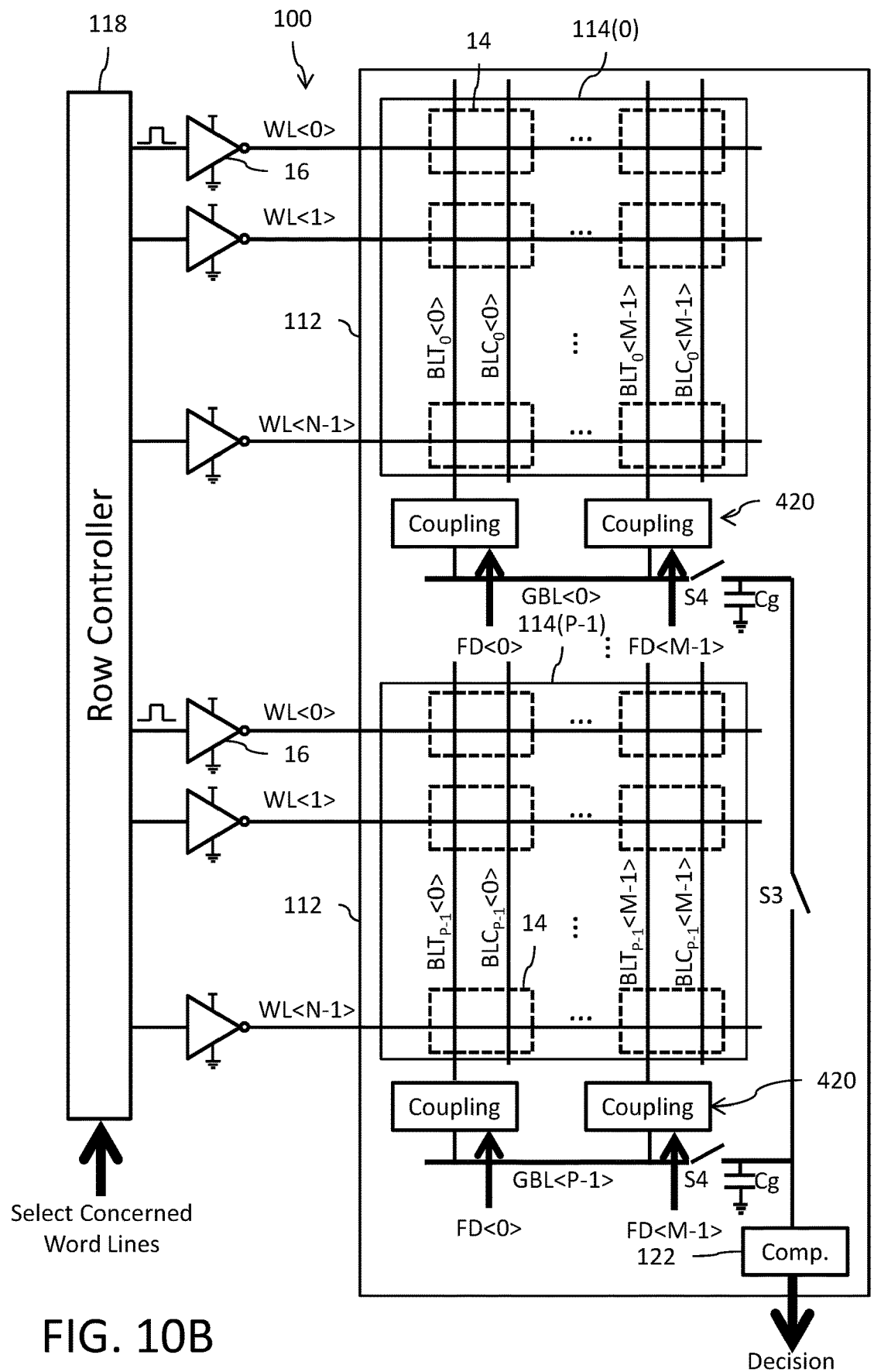

It will be noted from FIG. 10A that the global bit lines GBL are arranged to extend in a direction that is parallel with the columns in the sub-arrays 112. In an alternate embodiment, the global bit lines GBL can instead be arranged to extend in a direction that is parallel with the rows in the sub-arrays 112. This is shown in FIG. 10B where like references in FIG. 10A refer to same or similar components, the description of which will not be repeated for sake of brevity. The array 112 includes a plurality of global bit lines GBL<0> to GBL<P-1> that are coupled through coupling circuits 420 to corresponding (local) bit lines (shown here, by example only, as the true bit lines BLT<0> to BLT<M-1>) of the sub-arrays 114(0) to 114(P-1). So, the true bit lines $BLT_i$<j>, where i is the sub-array index from 0 to P-1 and j is the column index from 0 to M-1, for the sub-array 114(i), are each coupled through a coupling circuit 420 to the global bit line GBL<i>. For example, the true bit lines $BLT_0$<0> to $BLT_0$<M-1> for the sub-array 114(0) are coupled by coupling circuits 420 to the global bit line GBL<0>. Similarly, the true bit lines $BLT_{P-1}$<0> to $BLT_{P-1}$<M-1> for the sub-array 114(P-1) are coupled by coupling circuits 420 to the global bit line GBL<P-1>. The global bit lines GBL<0> to GBL<P-1> extend parallel to the rows of the sub-arrays 114 across the array 112. There is a switch S3 the functions to selectively couple all the global bit lines GBL<i>, for i=0 to P-1, together for charge sharing. Additionally, a switch S4 is provided to selectively couple each global bit line GBL<i> to its associated capacitor Cg. Lastly, bits FD of the feature data are applied to the coupling circuits 220 for the sub-arrays 114(0) to 114(P-1) such that the coupling operation is a function of the feature data bits FD. In an embodiment, the bits FD of the feature data (i.e., FD<0> through FD<M-1>) may be applied to the coupling circuits 420(0) through 420(M-1) in each of the sub-arrays 114(0) through 114(P-1) associated with a corresponding column.

The coupling circuits 420 may, for example, each have a circuit configuration as shown in FIG. 11A or 11B. Operation of the circuit of FIGS. 10B and 11A is as shown in FIG. 5B and further described in connection with FIGS. 10A and 11A. Likewise, operation of the circuit of FIGS. 10B and 11B is as shown in FIG. 5B and further described in connection with FIGS. 10A and 11B.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:
   a memory array including a plurality of sub-arrays, wherein each sub-array includes memory cells arranged in a matrix with plural rows and plural columns, each row including a word line connected to the memory cells of the row, and each column including a local bit line connected to the memory cells of the column, said memory cells configured to store bits of weight data for an in-memory compute operation;
   a word line driver circuit for each row having an output connected to drive the word line of the row;
   a row controller circuit configured to simultaneously actuate only one word line per sub-array for the in-memory compute operation by applying pulses through the word line driver circuits to the word lines; and
   a plurality of global bit lines, where each global bit line is capacitively coupled to a plurality of local bit lines.

2. The circuit of claim 1, wherein each global bit line extends parallel to corresponding columns of memory cells in the plurality of sub-arrays, and wherein each global bit line is capacitively coupled to the local bit lines of the corresponding columns of memory cells in the plurality of sub-arrays.

3. The circuit of claim 2, wherein an analog global output voltage on each global bit line is an average of local bit line voltages on said local bit lines of the corresponding columns of memory cells in the plurality of sub-arrays.

4. The circuit of claim 3, further comprising a computation circuit coupled to each global bit line and including an analog-to-digital converter (ADC) circuit configured to sample and convert the analog global output voltage from the global bit line to generate a digital decision output for the in-memory compute operation.

5. The circuit of claim 1, wherein each global bit line extends parallel to rows of memory cells in a corresponding sub-array of the plurality of sub-arrays, and wherein each global bit line is capacitively coupled to the local bit lines for columns of memory cells in the corresponding sub-array of the plurality of sub-arrays.

6. The circuit of claim 5, wherein an analog global output voltage on each global bit line is an average of local bit line voltages on said local bit lines for columns of memory cells in the corresponding sub-array of the plurality of sub-arrays.

7. The circuit of claim 6, further comprising a computation circuit coupled to each global bit line and including an analog-to-digital converter (ADC) circuit configured to sample and convert the analog global output voltage from the global bit line to generate a digital decision output for the in-memory compute operation.

8. The circuit of claim 1, wherein the pulses applied through the word line driver circuits to the word lines carry feature data for the in-memory compute operation.

9. The circuit of claim 1, wherein the pulses have a pulse width sufficient to ensure full discharge of the local bit line dependent on a bit logic state of the weight data.

10. The circuit of claim 1, further comprising a computation circuit coupled to each global bit line and including an analog-to-digital converter (ADC) circuit configured to sample and convert an analog global output voltage from the global bit line to generate a digital decision output for the in-memory compute operation.

11. The circuit of claim 1, further comprising a switching circuit configured to selectively connect at least two global bit lines of the plurality of global bit lines for charge sharing to generate an analog global output voltage.

12. The circuit of claim 11, further comprising a computation circuit including an analog-to-digital converter (ADC) circuit configured to sample and convert the analog global output voltage to generate a digital decision output for the in-memory compute operation.

13. The circuit of claim 1, further comprising a coupling circuit between each local bit line and the global bit line, wherein each coupling circuit comprises a capacitor having a first terminal coupled to the local bit line and a second terminal coupled to the global bit line.

14. The circuit of claim 13, wherein the capacitors of the coupling circuits coupled to a same global bit line of the plurality of global bit lines have a same capacitance.

15. The circuit of claim 13, wherein the capacitors of the coupling circuits coupled to a same global bit line of the plurality of global bit lines have different capacitances, and wherein the different capacitances are weighted.

16. The circuit of claim 1, further comprising a coupling circuit between each local bit line and the global bit line, wherein each coupling circuit comprises:
 a first capacitor having a first terminal coupled to the local bit line and a second terminal coupled to the global bit line; and
 a second capacitor having a first terminal coupled to the local bit line and a second terminal coupled to the global bit line.

17. The circuit of claim 16, wherein the first capacitor and second capacitor in each coupling circuit have different capacitances, and wherein the different capacitances are weighted.

18. The circuit of claim 17, where each coupling circuit further comprises:
 a first switch coupled in series with the first capacitor between the local bit line and the global bit line; and
 a second switch coupled in series with the first capacitor between the local bit line and the global bit line;
 wherein the first and second switches are selectively actuated in response to bits of feature data for the in-memory compute operation.

19. The circuit of claim 1, further comprising a coupling circuit between each local bit line and the global bit line, wherein each coupling circuit comprises:
 a first logical combination circuit configured to logically combine a signal on the local bit line with a first bit of feature data for the in-memory compute operation;
 a first capacitor having a first terminal coupled to an output of the first logical combination circuit and a second terminal coupled to the global bit line;
 a second logical combination circuit configured to logically combine the signal on the local bit line with a second bit of the feature data; and
 a second capacitor having a first terminal coupled to the local bit line and a second terminal coupled to the global bit line.

20. The circuit of claim 19, wherein the first capacitor and second capacitor in each coupling circuit have different capacitances, and wherein the different capacitances are weighted.

21. The circuit of claim 20, where each coupling circuit further comprises:
 a first switch coupled in series with the first capacitor between the local bit line and the global bit line, wherein the first switch is selectively actuated in response to a first control signal; and
 a second switch coupled in series with the first capacitor between the local bit line and the global bit line, wherein the second switch is selectively actuated in response to a second control signal.

22. The circuit of claim 21, wherein the first and second control signals are dependent on said first and second bits of the feature data.

23. The circuit of claim 1, further comprising:
 a capacitor for each global bit line; and
 a switch configured to selectively couple the global bit line to the capacitor, wherein said switch is actuated in response to a control signal.

24. The circuit of claim 23, further comprising a computation circuit including an analog-to-digital converter (ADC) circuit configured to sample and convert an analog global output voltage on the capacitor to generate a digital decision output for the in-memory compute operation.

* * * * *